(12) United States Patent
Tanaka et al.

(10) Patent No.: US 7,873,333 B2
(45) Date of Patent: Jan. 18, 2011

(54) TRANSMITTER CIRCUITS AND APPARATUS OF WIRELESS APPLICATION

(75) Inventors: Satoshi Tanaka, Kokubunji (JP); Yukinori Akamine, Kokubunji (JP)

(73) Assignee: Renesas Electronics Corporation, Kanagawa (JP)

( * ) Notice: Subject to any disclaimer, the term of this patent is extended or adjusted under 35 U.S.C. 154(b) by 630 days.

(21) Appl. No.: 11/755,273

(22) Filed: May 30, 2007

(65) Prior Publication Data

US 2007/0281652 A1 Dec. 6, 2007

(30) Foreign Application Priority Data

May 31, 2006 (JP) ............................. 2006-151762

(51) Int. Cl.
*H01Q 11/12* (2006.01)
*H04B 1/04* (2006.01)

(52) U.S. Cl. ......................................... 455/126; 455/91
(58) Field of Classification Search ................. 455/126, 455/127.1–4, 121.2, 274, 226, 333
See application file for complete search history.

(56) References Cited

U.S. PATENT DOCUMENTS 6,295,442 B1 * 9/2001 Camp et al. .................. 455/102

7,424,276 B2 * 9/2008 Yamawaki et al. ....... 455/114.3

OTHER PUBLICATIONS

"Highly Integrated Radio Transceiver with Power Amplifier for GSM/GPRS/EDGE Applications" Polaris™ 2 TOTAL RADIO™ Total Radio Solution 2005.
Electronics Letters 10$^{th}$ May 1979, vol. 15 No. 10., pp. 286-288.

* cited by examiner

*Primary Examiner*—Yuwen Pan
*Assistant Examiner*—Ankur Jain
(74) *Attorney, Agent, or Firm*—Mattingly & Malur, P.C.

(57) ABSTRACT

In conventional polar-loop transmitter circuits, using two feedback circuits intended to control the amplitude in an open loop and phase of a power output in closed loop, respectively, during transmission, causes current consumption to increase during delivery of a small power output. Therefore, a complex table has to be prepared in order to correct the nonlinearities in the amplitude-to-amplitude characteristic of the power amplifier and the amplitude-to-phase characteristic thereof. In order to reduce the current consumption required for the delivery of a moderate or small power output, a polar-loop transmitter circuit in which two feedback circuits intended to control the amplitude and phase of the power output respectively are active when the power amplifier delivers a large power output exhibiting strong nonlinearity, and when the power amplifier delivers a moderate or small power output, the amplitude of the power output is controlled in the open loop.

15 Claims, 21 Drawing Sheets

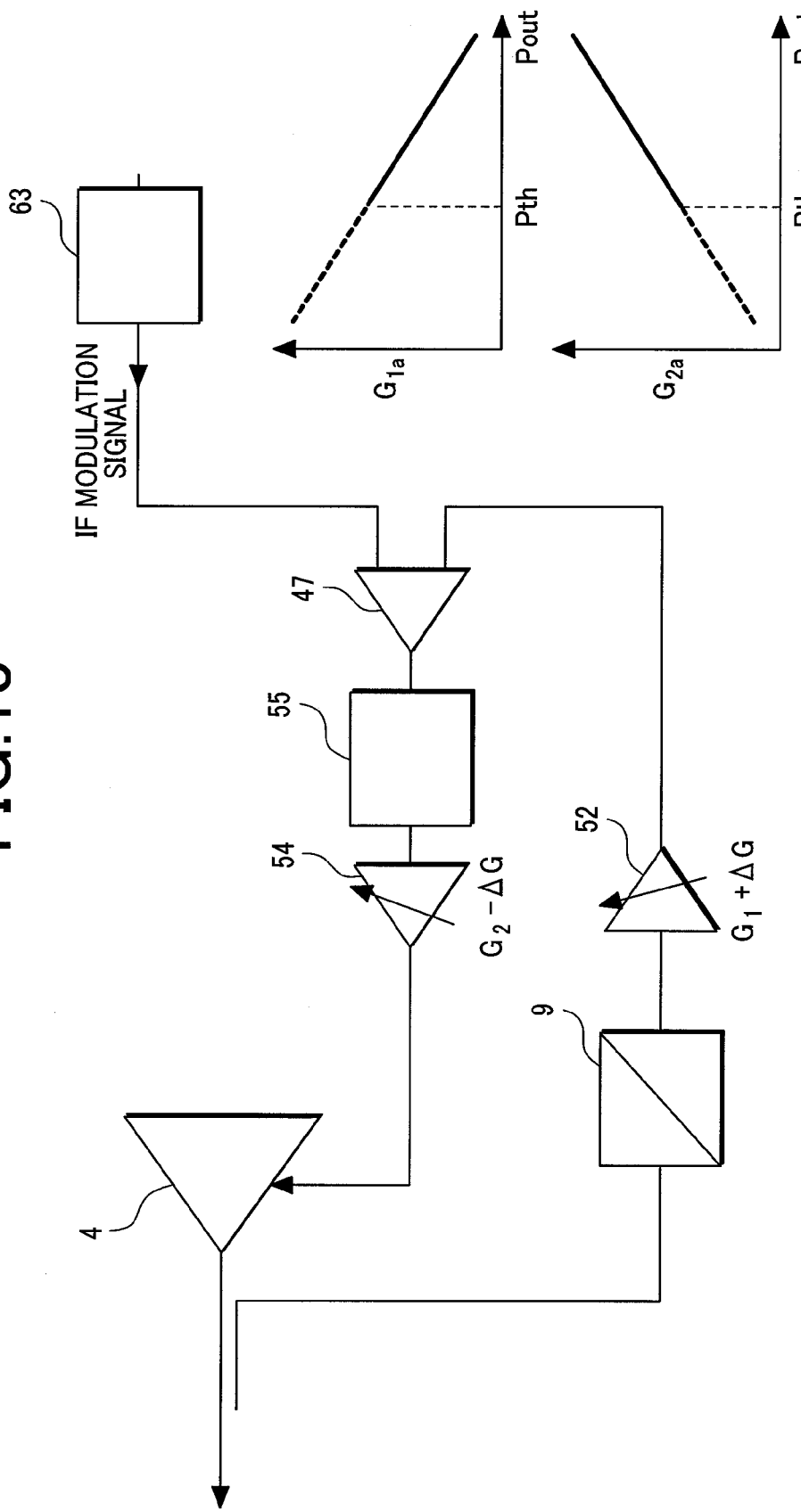

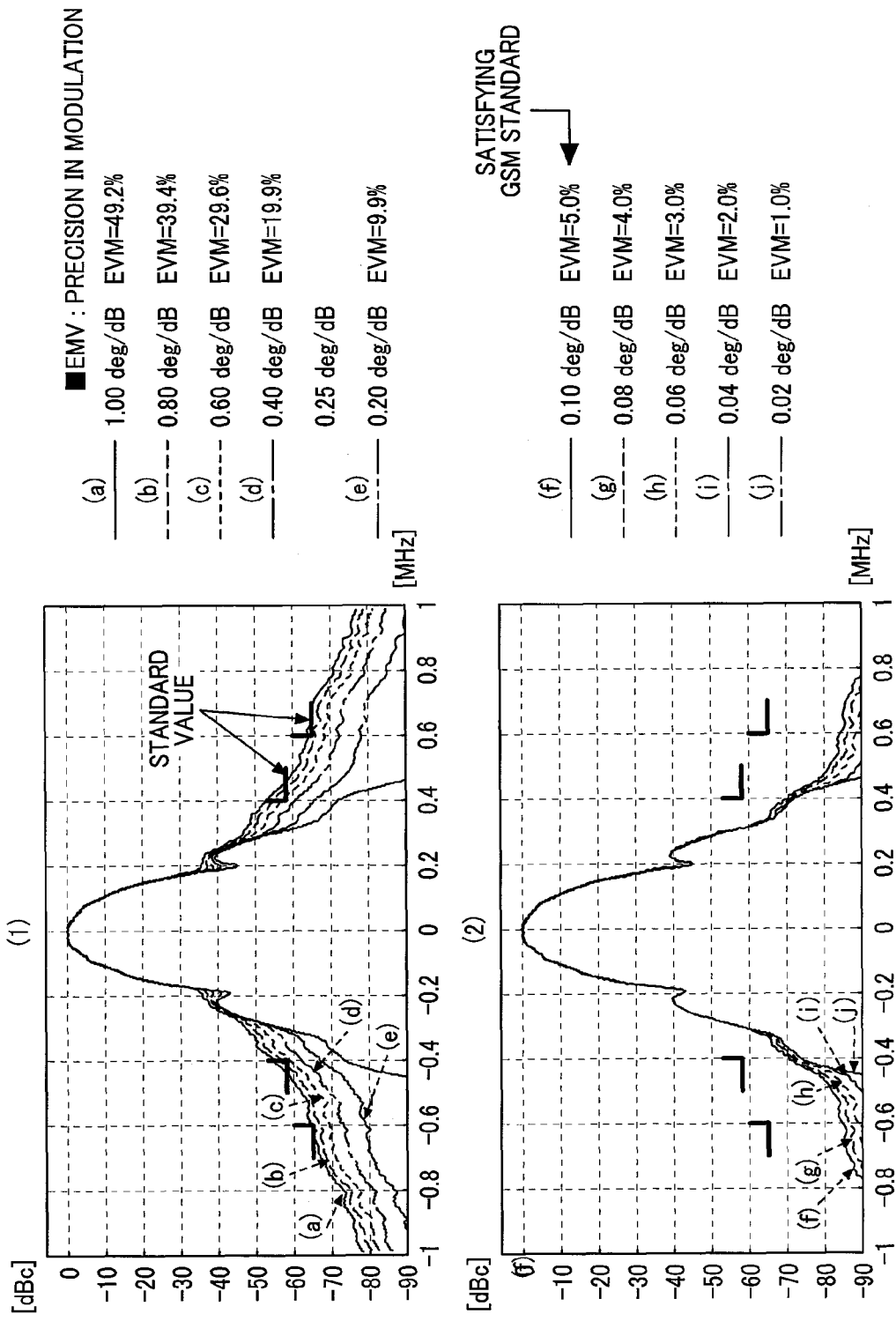

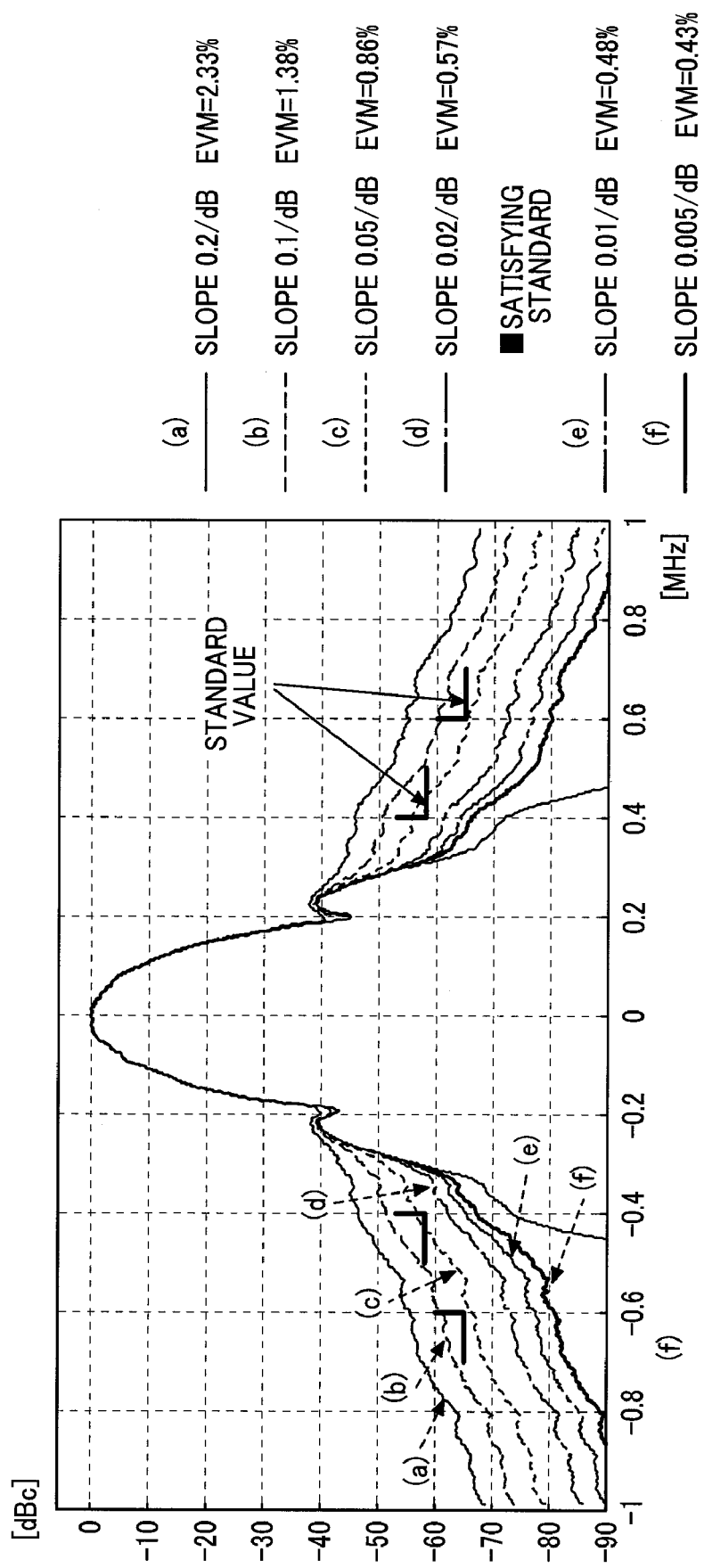

TRANSMITTER CIRCUITS AND APPARATUS OF WIRELESS APPLICATION

CLAIM OF PRIORITY

The present application claims priority from Japanese application JP 2006-151762 filed on May 31, 2006, the content of which is hereby incorporated by reference into this application.

FIELD OF THE INVENTION

The present invention relates to transmitter circuits and an apparatus for a wireless application using the transmitter circuits. More particularly, the present invention is concerned with a transmitter circuit for mobile communications or for portable cellular phones, or a transmitter circuit suitable for the Enhanced Data GSM Environment (EDGE) that is a broadband transmission facility evolved from the Global System for Mobile Communications (GSM) which is the cellular phone system prevalent throughout Europe, and an apparatus for wireless applications using the transmitter circuits.

BACKGROUND OF THE INVENTION

Existing polar-loop transmitter circuits include a type of transmitter circuit in which: a signal transferred from a signal source is defined in the system of polar coordinates representing phases and amplitudes, and fed back to a power amplifier via a buffer amplifier and an amplitude comparator; and the power amplifier delivers a modulated signal (refer to, for example, "Polar-Loop Transmitter" by V. Petrovic and W. Gosling (Electronics Letters, Vol. 15, No. 10, pp. 286-2X, May 1979).

A type of polar-loop transmitter circuit having a power level thereof lowered is realized as a digital sigma transmitter to which an amplitude modulator is added (refer to, for example, "RF Micro Devices Polaris" (2 Total Radio Solutions)).

SUMMARY OF THE INVENTION

The Global System for Mobile Communications (GSM) that is the European cellular phone system is currently the most prevalent system having been adopted in the nearly whole world except Japan and South Korea. Enhanced Data GSM environment (EDGE) services have recently started as high-data rate services intended to cope with a demand for data communications among portable cellular phones, and are expected to further prevail. The Gaussian minimum shift keying (GMSK) that is a modulation technique of allocating information to the phases of a signal with the amplitude thereof held constant is adopted for normal intercommunication of voice. The EDGE employs the 8-phase shift keying (8-PSK) technique of allocating information even to amplitudes of a signal. Two related arts to be described below provide typical examples that are compatible with both the techniques.

The first related art is of the polar loop type like the one disclosed in, for example, the former document of "Polar-Loop Transmitter". FIG. 19 shows a polar-loop circuit. In FIG. 19, there are shown a loop filter 3, a high-frequency power amplifier 4, an amplitude comparator 5, a loop filter 6, a selection switch 7, a selection switch 8, a mixer 9, an amplitude-modulated wave detection circuit 10, and a limiter amplifier 11. Moreover, there are shown a coupler 49, an intermediate-frequency modulating signal source 85, a synthesizer 86 serving as a local signal source, a buffer amplifier 87, a low-pass filter 89, and an antenna 115. The polar-loop type is such that: signals transferred from the signal sources 85 and 86 respectively are defined in a system of polar coordinates representing phases and amplitudes and fed back to the power amplifier 4 via the buffer amplifier 87 and amplitude comparator 5 respectively; and the power amplifier delivers a modulated signal.

The second related art is of a polar-loop type that has a power level thereof lowered in the same manner as the one disclosed in, for example, the latter document of "RF Micro Devices Polaris" and that is realized as a ΔΣ transmitter to which an amplitude modulator is added. In this example, an analog transmittal signal sent from a baseband integrated circuit (IC) is converted into a digital signal by a radiofrequency IC. The resultant digital transmittal signal is transferred to a modulator, and further transferred to a power amplifier, which is included in a power amplifier module, via a synthesizer and a voltage-controlled oscillator. Consequently, the digital transmittal signal has the amplitude thereof modulated based on an output of the modulator. The power output of the power amplifier module is fed to an antenna via a switching module. On the other hand, power received by the antenna is handled by an I-channel/Q-channel orthogonal mixer, a filter, and a gain programmable amplifier array included in the radiofrequency IC, and a baseband digital filter included in the baseband IC via the switching module, and then fetched as a received signal via a baseband digital filter. In this type, the amplitude of a signal is controlled in a configuration of an open loop and the phase thereof alone is controlled in a configuration of a closed loop.

However, a problem to be solved underlies each of the two foregoing related arts. In the former polar-loop transmitter circuit, two feedback circuits for use in controlling an amplitude or a phase are active during transmission. This poses a problem in that current consumption increases especially when output power is small. On the other hand, in the latter polar-loop low-power type in which the amplitude is controlled in an open loop and the phase alone is controlled in a closed loop, since the power amplifier or power amplifier module (hereinafter, simply, a power amplifier) is controlled in the open loop, the circuit scale may be small. This is helpful in lowering power consumption.

The loaded impedance of a power amplifier included in a transmitter circuit greatly varies depending on the environment of an antenna. In the latter type of transmitter circuit, if the power amplifier is controlled in an open loop, measures have to be taken against the variation in loaded impedance derived from a change in the environment of the antenna. A complex table may be devised in order to correct the nonlinearities in the relationship of the amplitude of an input of the power amplifier to the amplitude of an output thereof and the relationship of the amplitude of the output of the power amplifier to the phase of the output thereof, that is, the amplitude-to-amplitude characteristic of the power amplifier and the amplitude-to-phase characteristic thereof. In consideration of diverse use environments, there is difficulty in putting the latter type of transmitter circuit to practical use. An isolator may presumably be connected in order to alleviate the adverse effect of the variation in the environment of the antenna. However, a power loss occurring in the transmitter circuit increases.

One of the objects of the present invention is to provide a transmitter circuit in which the control characteristic of a power amplifier can be properly sustained irrespective of a use environment, and which requires little current consumption.

A typical example of the present invention will be presented below. Specifically, a transmitter circuit in accordance with the present invention includes a phase locked loop that is used to control the phase of a power output of a power amplifier, an amplitude loop that is used to control the amplitude of the power output thereof, and a switching control unit that switches the amplitude loop from a closed loop to an open loop or vice verse. When the power amplifier delivers a large power output, the switching control unit brings the amplitude loop to the closed loop. When the power amplifier delivers a small power output, the switching control unit brings the amplitude loop to the open loop.

According to the present invention, when the power amplifier delivers a large power output exhibiting strong nonlinearity, a transmitter circuit in which two feedback circuits to be used to control an amplitude and a phase respectively are active is started. When the power amplifier delivers a moderate or small power output, the amplitude is controlled in an open loop. Thus, the control characteristic of the power amplifier is properly sustained irrespective of a use environment. Moreover, current consumption required to deliver the moderate or small power output can be reduced.

BRIEF DESCRIPTION OF THE DRAWINGS

These and other features, objects and advantages of the present invention will become more apparent from the following description when taken in conjunction with the accompanying drawings wherein:

FIG. 13 is an explanatory diagram concerning the operation of the second embodiment of the present invention;

FIG. 14B shows the results of the simulation performed under the conditions shown in FIG. 14A;

FIG. 15B shows the results of the simulation performed under the conditions shown in FIG. 15A;

DETAILED DESCRIPTION OF THE PREFERRED EMBODIMENTS

Figure 1:
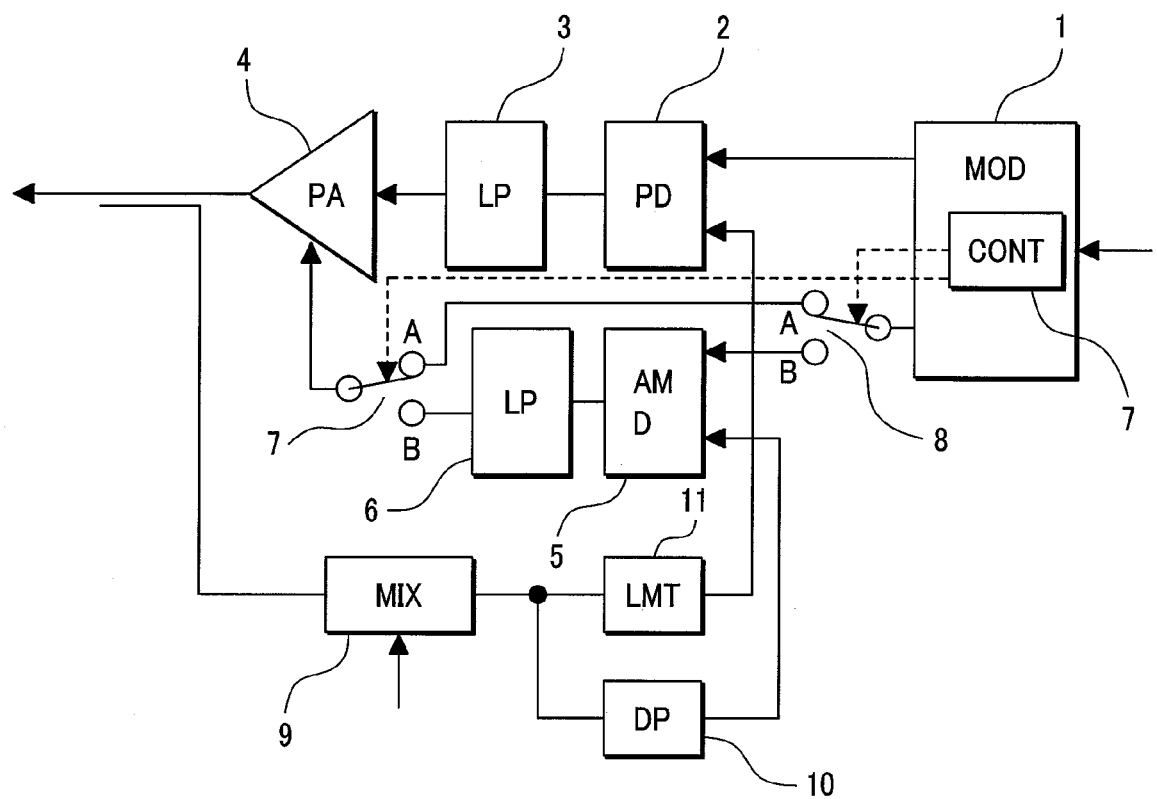
FIG. 1 shows a transmitter circuit in accordance with the first embodiment of the present invention.

Referring to the drawings, embodiments of the present invention will be described below.

First Embodiment

To begin with, a transmitter circuit in accordance with the first embodiment of the present invention will be described in conjunction with FIG. 1 to FIG. 9.

Figure 2:
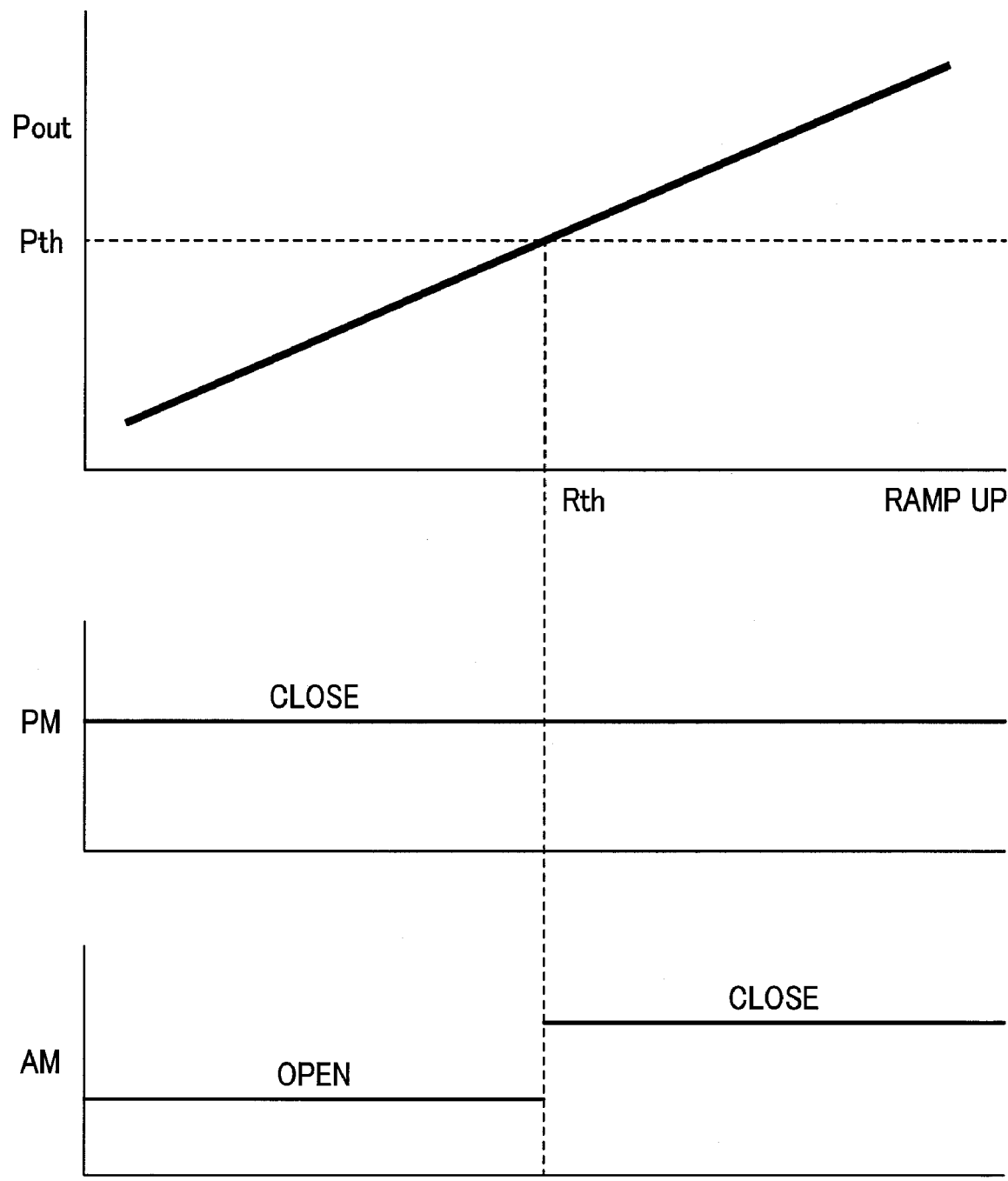
FIG. 2 is an explanatory diagram graphically showing the operation of the transmitter circuit shown in FIG. 1.

First, the fundamental configuration of the first embodiment will be described in conjunction with FIG. 1 and FIG. 2. FIG. 1 shows a transmitter circuit in accordance with the first embodiment of the present invention. FIG. 2 is an explanatory diagram concerning the operation of the transmitter circuit shown in FIG. 1.

The transmitter circuit shown in FIG. 1 is employed in an apparatus for wireless applications that is suitable for the EDGE which is a broadband transmission facility evolved from the GSM. Reference numeral 1 denotes a modulator. The modulator 1 receives transmittal information (a ramp signal or transmittal data) from a baseband circuit (not shown), and produces and transmits a transmittal signal or a phase-or amplitude-modulated signal. A phase-modulated (PM) signal produced by the modulator 1 is transmitted to a phase detector 2, and a signal having passed through a loop filter 3 is transmitted to a high-frequency power amplifier (hereinafter, simply, a power amplifier) 4. Moreover, output information of the power amplifier 4 is sensed by a coupler. Sensed phase information is fed back to the phase detector 2 via a mixer 9 and a limiter amplifier 11. The phase detector 2 compares the phase information with the phase-modulated signal sent from the modulator 1. A signal having the phase thereof regulated based on the result of the comparison is transmitted to the power amplifier 4. Reference numeral 5 denotes an amplitude comparator and reference numeral 6 denotes a loop filter. Output information of the power amplifier 4 is sensed by the coupler, and amplitude information is fed back to the amplitude comparator 5 via the mixer 9 and an amplitude-modulated wave detection circuit 10. The loop filter 6 corrects the amplitude information on the basis of the result of the comparison of the amplitude information with the amplitude-modulated signal sent from the modulator 1. The resultant amplitude information is applied to the control input terminal of the power amplifier 4. Reference numeral 7 denotes a selection switch that switches the connection of the bias input terminal of the power amplifier 4 into the connection through a contact 7-A or the connection through a contact 7-B. Reference numeral 8 denotes a selection switch that switches the connection of the amplitude-modulated (AM) output terminal of the modulator 1 into the connection through a contact 8-A or the connection through a contact 8-B. Reference numeral 700 denotes a switching control circuit that compares transmittal information, which is used to control a power output of the power amplifier 4, with a predetermined threshold Pth, and transmits a control signal with which the connections through the selection switches 7 and 8 are switched. In other words, the switching control circuit 700 and selection switches 7 and 8 constitute a switching control unit that selects an amplitude control loop in the transmitter circuit from an open loop to a closed loop or vise versa.

The switching control circuit 700 compares a power output Pout of the power amplifier 4 (specifically, transmittal information Ramp-Up to be transferred to the modulator 1) with a predetermined threshold Pth (more specifically, a threshold Rth for the transmittal information). If the power output Pout is smaller than the threshold Pth, that is, the power output is moderate or small (or small), the connections through the selection switches 7 and 8 are switched to select the connections through the contacts A, that is, set to the states indicated with solid lines in FIG. 1. Accordingly, as shown in FIG. 2, the phase of a signal to be sent from the transmitter circuit is controlled by a feedback circuit composed of the power amplifier 4, coupler, mixer 9, limiter amplifier 11, phase detector 2, and loop filter 6. For control of an amplitude, since the feedback circuit composed of the amplitude comparator 5 and loop filter 6 is broken, open-loop control is implemented so that the power amplifier 4 will have the amplitude of the power output thereof modified directly based on an amplitude-modulated output signal of the modulator 1.

On the other hand, when the power output Pout of the power amplifier 4 (transmittal information transferred to the modulator 1) is larger than the predetermined threshold Pth, the connections through the selection switches 7 and 8 are switched to select the connections through the contacts B. Accordingly, the power output of the power amplifier 4 is fed back to the amplitude comparator 5 via the coupler, mixer 9, and amplitude-modulated wave detection circuit 10. The loop filter 6 corrects the amplitude of the power output of the power amplifier 4 on the basis of the result of comparison of the power output with a modulated output signal of the modulator 1. Thus, a polar loop circuit is configured. Namely, the amplitude of a signal to be sent from the transmitter circuit is, as shown in FIG. 2, controlled in the closed loop. Consequently, when the transmitter circuit provides a large power output, the transmitter circuit is configured to a polar-loop transmitter circuit in which the output power of the power amplifier 4 is controlled based on the amplitude and phase of a modulated signal, which is produced by the modulator 1, corrected by the two feedback circuits.

As mentioned above, in the present embodiment of the present invention, when the power amplifier delivers a large power output exhibiting strong nonlinearity, the transmitter circuit is operated as a polar-loop transmitter circuit in which the two feedback circuits to be used to control an amplitude and a phase respectively are active. When the power amplifier delivers a moderate or small power output, the amplitude of the power output is controlled in an open loop in order to reduce current consumption to be required for the delivery of the moderate or small power output. Moreover, the relationship between the amplitude of an input of the power amplifier and the amplitude of an output thereof and the relationship between the amplitude of the output thereof and the phase of the output thereof, that is, the amplitude-to-amplitude characteristic of the power amplifier and the amplitude-to-phase characteristic thereof are properly sustained irrespective of whether the output power is large or small.

The switching of the connections through the selection switches 7 and 8 is achieved based on the result of comparison of ramp-up data contained in transmittal information transferred to the modulator 1 with the predetermined threshold Rth. The predetermined threshold Rth is determined to tolerate a variation in the characteristic of the power amplifier 4. Moreover, preferably, the threshold Rth can be set to any value or modified according to a purpose of use. Furthermore, any other information equivalent to the power output Pout of the power amplifier 4 may be used and compared with a predetermined threshold.

Next, a description will be made of a concrete example of the configuration of the power amplifier 4 shown in FIG. 1 and the relationship of the switching of the connections through the selection switches 7 and 8 included in the configuration to a predetermined threshold Pth (or Rth).

Figure 3:
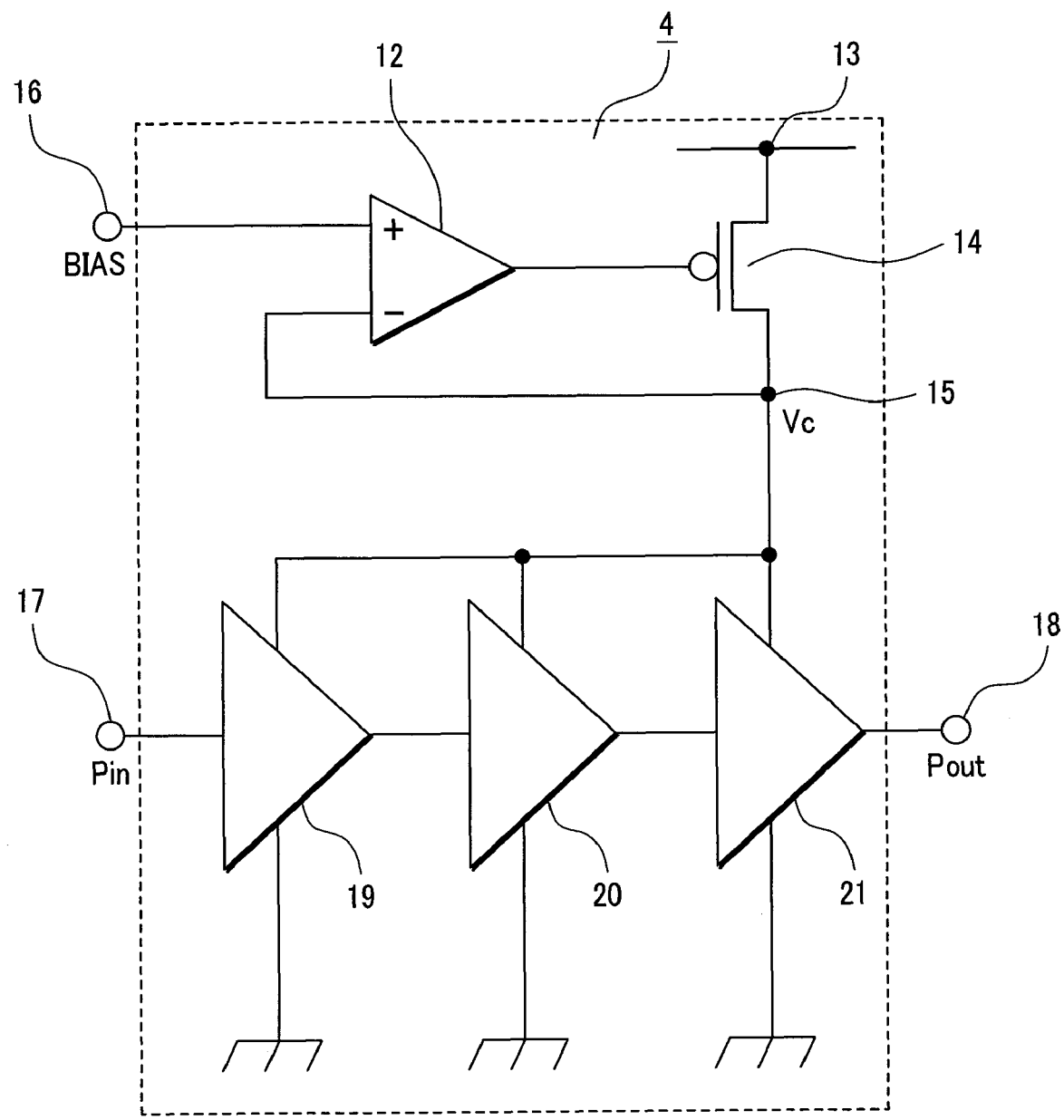
FIG. 3 shows an example of a power amplifier employed in the first embodiment of the present invention.

FIG. 3 shows a concrete example of the circuitry of the power amplifier 4.

In the power amplifier, a regulator is connected to the power amplifier 4 so that the power output of the power amplifier can be controlled by regulating a supply voltage thereof. Specifically, the power amplifier 4 includes an operational amplifier 12, a power terminal 13, a p-type MOSFET 14, an internal power terminal 15, a bias control input terminal 16, an input terminal 17, an output terminal 18, an initial-stage amplifier 19, a second-stage amplifier 20, and a final-stage amplifier 21. For control of the power output, a regulator composed of the power terminal 13, operational amplifier 12, p-type MOSFET 4, internal power terminal 15, and bias control input terminal 16 is included in order to apply a supply voltage to the initial-stage amplifier 19, second-stage amplifier 20, and final-stage amplifier included in the power amplifier 4.

Figure 4:
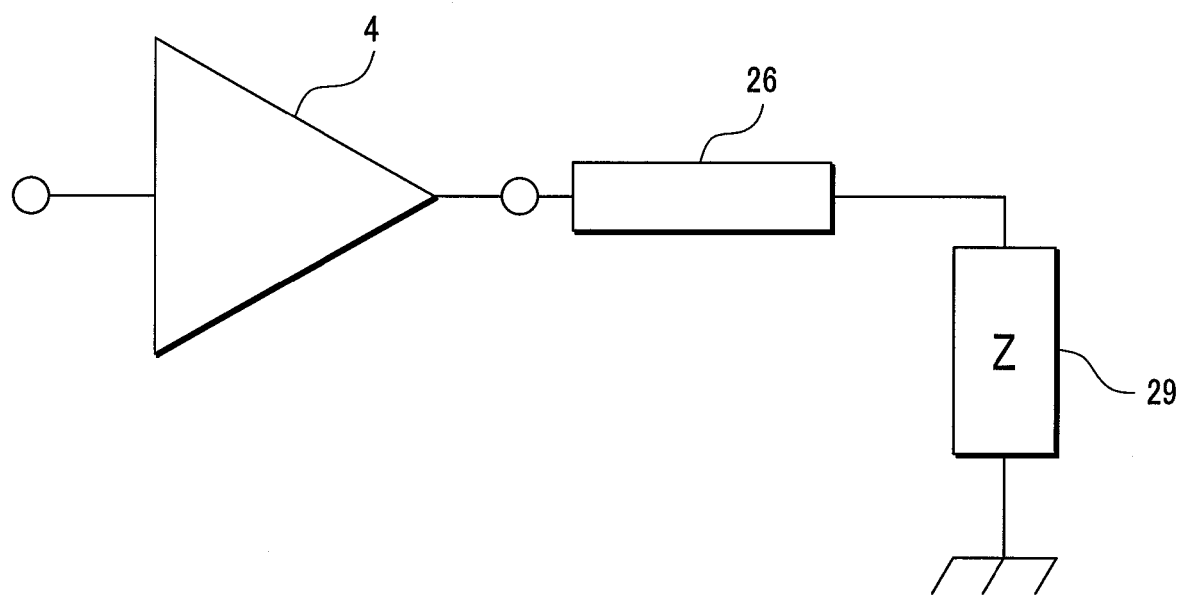
FIG. 4 shows the relationship between the power amplifier and loaded impedance.

FIG. 4 shows the relationship between the power amplifier 4 shown in FIG. 3, an output matching circuit 26, and loaded impedance (Z) 29 of the power amplifier 4. The loaded impedance (Z) greatly varies depending on the environment of an antenna. The transmitter circuit in accordance with the present invention does not use an isolator to minimize a power loss but diminishes the adverse effect of a variation dependent on the environment of an antenna. Especially in the GSM, since a signal having the phase thereof modulated with the amplitude thereof held constant is transmitted at a requested output level, the power amplifier can always operate in the saturation thereof. However, in the EDGE, since information is also allocated to the amplitude of a signal, the power amplifier should be devised to operate linearly irrespective of a variation in a use environment. Therefore, the present invention is characterized in that the operating point indicating the operating conditions for the selection switches 7 and 8 is set to a point indicating the predetermined threshold Pth. This will be described below.

Figure 5:
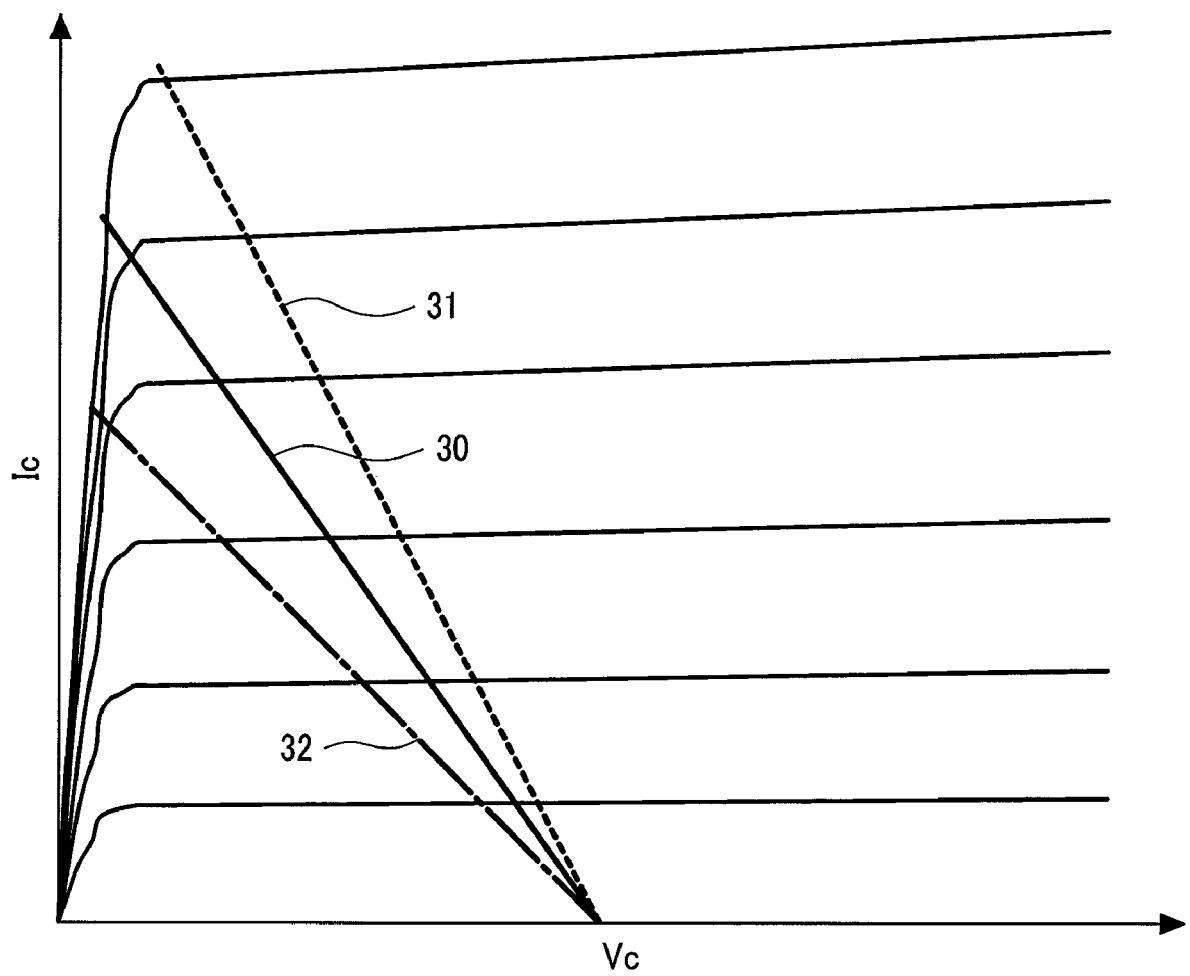
FIG. 5 shows the relationship between a variation in loaded impedance and a power output delivered by the power amplifier shown in FIG. 3.

FIG. 5 shows characteristic curves indicating a variation in the loaded impedance of the power amplifier 4 shown in FIG. 3 and employed in the first embodiment of the present invention. Reference numeral 30 denotes a load line indicating a variation in loaded impedance occurring when the power amplifier delivers a maximum power output. Reference numeral 31 denotes a load line indicating a variation in loaded impedance occurring when the power amplifier delivers a maximum power output and the loaded impedance assumes small values. Reference numeral 32 denotes a load line indicating a variation in loaded impedance occurring when the power amplifier delivers a maximum power output and the loaded impedance assumes large values.

Figure 6:
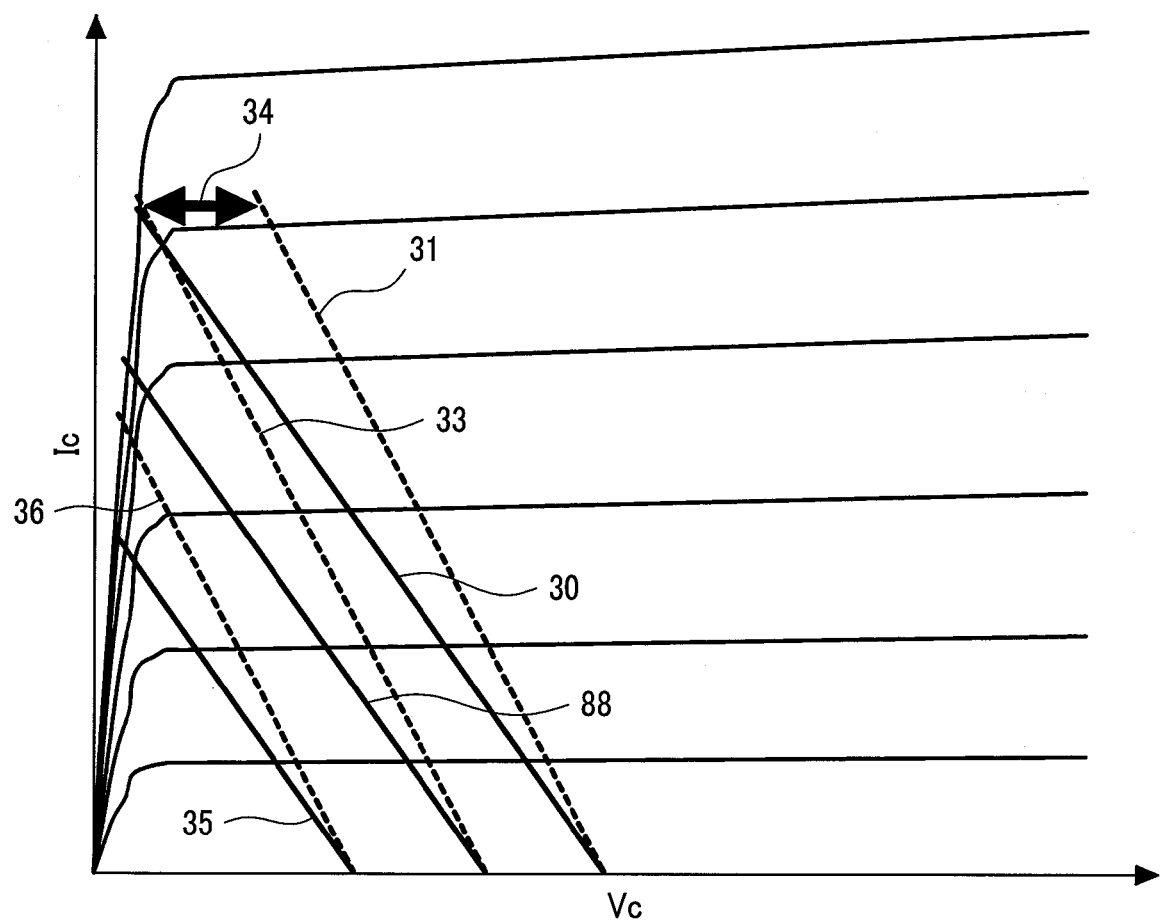
FIG. 6 graphically shows a variation in the loaded impedance of the power amplifier shown in FIG. 3 which is derived from a change in a supply voltage.

FIG. 6 shows a variation in loaded impedance following a change in a supply voltage that occurs in the first embodiment of the present invention. Reference numeral 88 denotes a load line indicating a variation in loaded impedance occurring when the power amplifier delivers a moderate power output.

Reference numeral 33 denotes a load line indicating a variation in loaded impedance occurring when the power amplifier delivers a moderate power output and the loaded impedance assumes small values. Reference numeral 35 denotes a load line indicating a variation in loaded impedance occurring when the power amplifier delivers a small power output. Reference numeral 36 denotes a load line indicating a variation in loaded impedance occurring when the power amplifier delivers a small power output and the loaded impedance assumes small values. Reference numeral 34 denotes a difference of an internal supply voltage.

As apparent from the drawings, when the power amplifier delivers a moderate power output or a small power output and the loaded impedance assumes small values, the load lines 33 and 36 are drawn in a region on the graph indicating the saturation of the power amplifier 4. When open-loop control is extended, an output of the power amplifier 4 has the amplitude modified based on the output of the modulator 1. However, when the power amplifier delivers a maximum power output and the loaded impedance assumes small values, the load line 31 is drawn outside the region on the graph, which indicates the saturation, by the length indicating the difference 34 of an internal supply voltage. This means that even when open-loop control is extended, the power output of the power amplifier 4 cannot be controlled to have the amplitude thereof modified accurately based on the output of the modulator 1.

In the present embodiment, the load line 30 indicating a variation in the loaded impedance occurring when the power amplifier delivers the maximum power output is adopted as a border line (in practice, with a little tolerance). Relative to the values of the power output and loaded impedance indicated on the right side of the load line 30, the transmitter circuit shall be configured to a polar-loop transmitter circuit for the purpose of extending closed-loop control. Relative to the values of the power output and loaded impedance indicated on the left side of the load line 30, the transmitter circuit shall be configured to an open-loop transmitter circuit.

Figure 7:
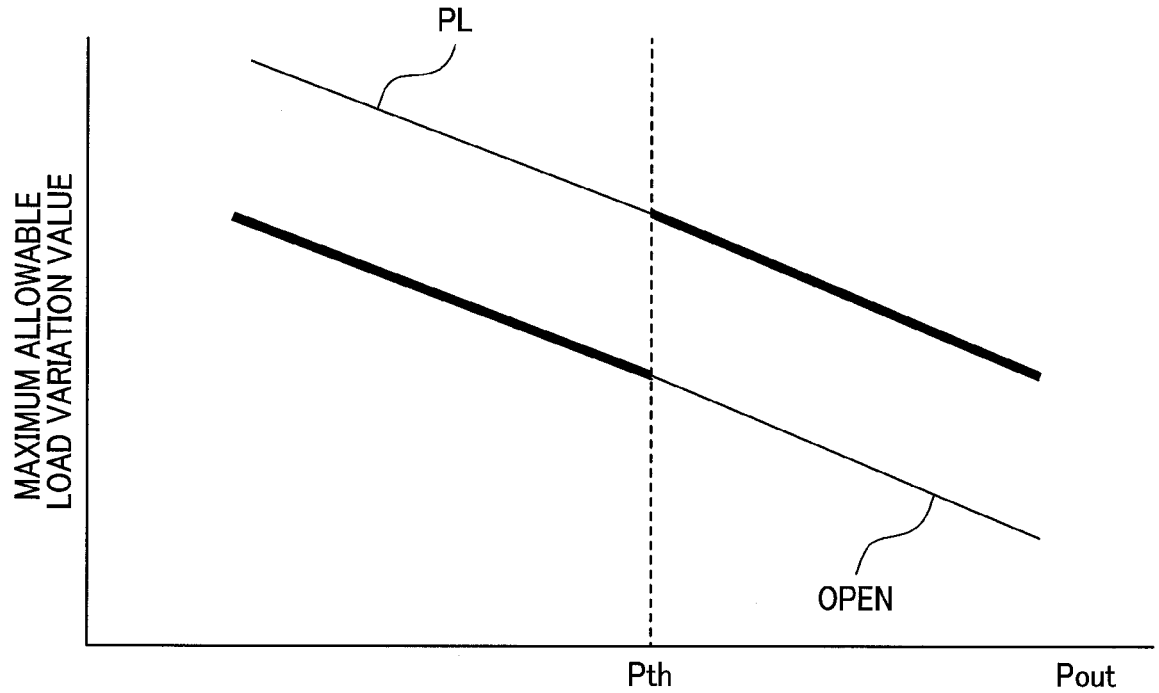
FIG. 7 graphically shows the relationship between the power output of the power amplifier employed in the first embodiment of the present invention and a maximum allowable load variation value.

FIG. 7 shows characteristic curves indicating the relationships between the power output of the power amplifier employed in the first embodiment of the present invention and a maximum allowable load variation value. In the present embodiment, when the power amplifier 4 delivers a large power output and a load varies largely, the switching control circuit 700 causes the transmitter circuit to operate as a polar-loop transmitter circuit. When the power amplifier 4 delivers a moderate or small power output and the load varies a little, the switching control circuit 700 causes the transmitter circuit to operate as an open-loop transmitter circuit. As apparent from the description made in conjunction with FIG. 6, since a predetermined maximum allowable load variation value is tolerated irrespective of the loaded impedance of the power amplifier 4, the power amplifier 4 can be properly controlled. Moreover, when the power amplifier delivers a moderate or small power output, the transmitter circuit is operated to extend open-loop control for the amplitude of a power output. Thus, a transmitter circuit that requires little current consumption is provided.

Figure 8:
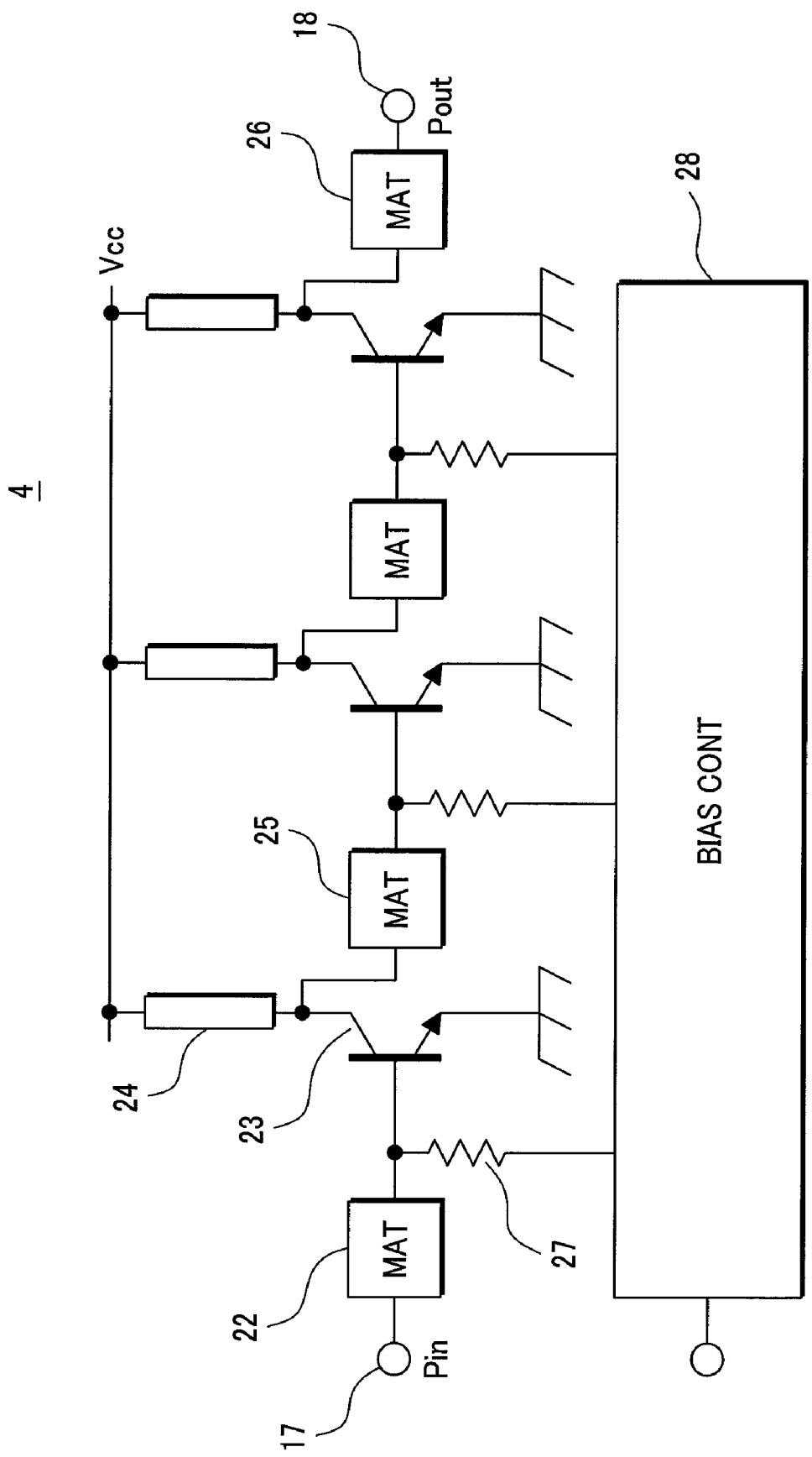
FIG. 8 shows another example of the power amplifier employed in the first embodiment of the present invention.

FIG. 8 shows another example of the power amplifier 4 employed in the first embodiment shown in FIG. 1. In this example, the power output of the power amplifier 4 is controlled by adjusting a gate voltage or a base bias to be applied in the power amplifier 4. There are shown an input terminal 17, an output terminal 18, an input matching circuit 22, a heterojunction bipolar transistor (HBT) 23, a resistor 24, an inter-stage matching circuit 25, an output matching circuit 26, a bias resistor 27, and a bias circuit 28.

Figure 9:
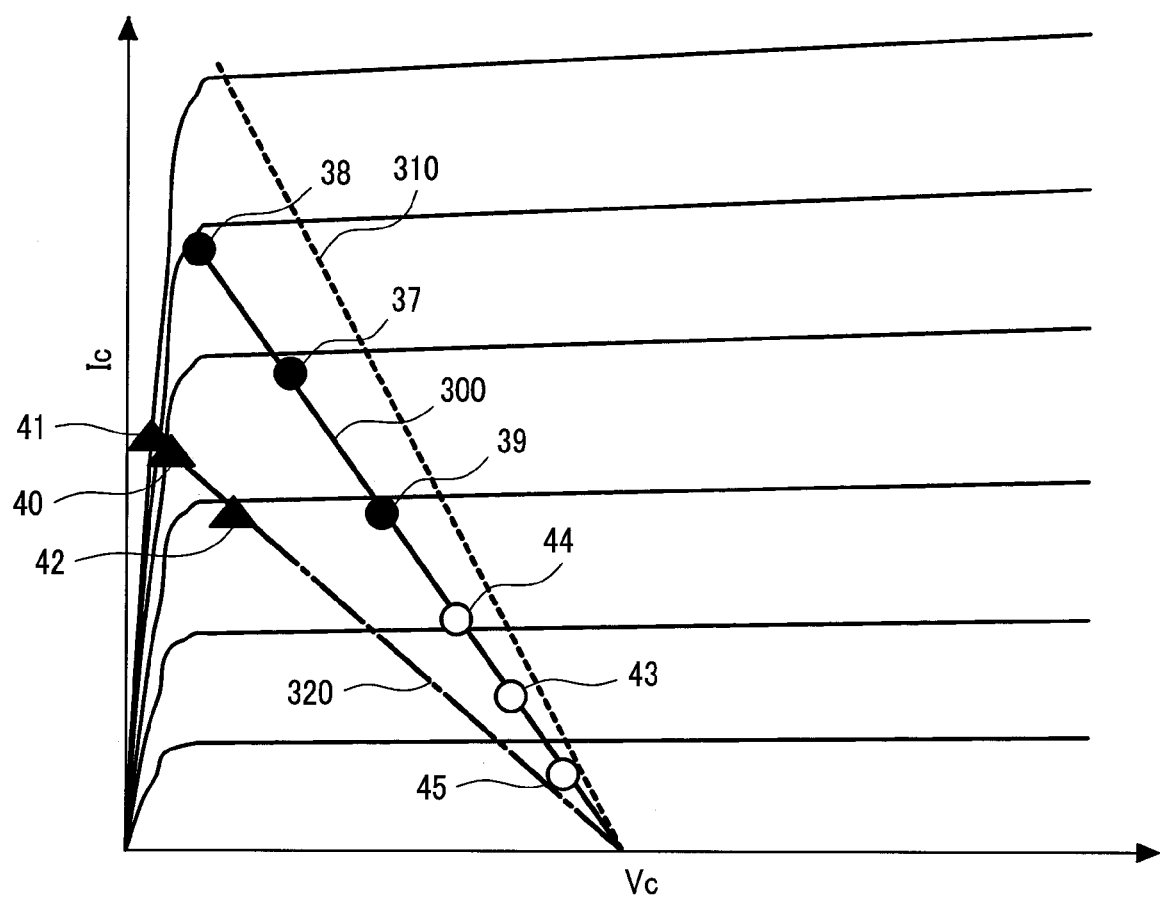
FIG. 9 graphically shows a variation in the loaded impedance of the power amplifier shown in FIG. 8 which is derived from a change in a supply voltage.

FIG. 9 graphically shows a variation in a loaded impedance following a change in a supply voltage to be fed to the first embodiment adopting the base-bias power amplifier 4 shown in FIG. 8. In the drawing, reference numeral 300 denotes a load line indicating a variation in loaded impedance that occurs when the power amplifier delivers a maximum power output. Reference numeral 310 denotes a load line indicating a variation in loaded impedance that occurs when the power amplifier delivers a maximum power output and the loaded impedance assumes small values. Reference numeral 320 denotes a load line indicating a variation in loaded impedance that occurs when the power amplifier delivers a maximum power output and the loaded impedance assumes large values. Reference numeral 37 denotes a bias application point applying a bias to the amplifier relative to a maximum power output. Reference numeral 38 denotes a maximum bias application point applying a bias to the amplifier relative to a modulated wave. Reference numeral 39 denotes a minimum bias application point applying a bias to the amplifier relative to the modulated wave. Reference numeral 40 denotes a bias application point applying a bias to the amplifier relative to a maximum power output responsively to a variation in a load. Reference numeral 41 denotes a maximum bias application point applying a bias to the amplifier relative to a modulated wave of a maximum power output responsively to a variation in a load. Reference numeral 42 denotes a minimum bias application point applying a bias to the amplifier relative to the modulated wave of the maximum power output responsively to a variation in a load. Reference numeral 43 denotes a bias application point applying a bias to the amplifier relative to a moderate power output. Reference numeral 44 denotes a maximum bias application point applying a bias to the amplifier relative to a modulated wave of a moderate power output. Reference numeral 45 denotes a minimum bias application point applying a bias to the amplifier relative to the modulated wave of the moderate power output.

When the power amplifier delivers a moderate power output, the values of loaded impedances at the bias application points (43, 44, and 45) are plotted linearly. Even when open-loop control is extended, the base-bias power amplifier 4 can be controlled so that the amplitude of the power output thereof will be modified based on the output of the modulator 1.

However, in the situation indicated with the load line 320, that is, when the power amplifier delivers a maximum power output and the loaded impedance assumes large values, the power amplifier 4 is saturated and can hardly be controlled. Specifically, the bias application point 40 applying a bias to the base-bias controlled amplifier relative to a maximum power output responsively to a variation in a load, and the bias application point 41 applying a bias to the amplifier relative to a modulated wave of a maximum power output responsively to the variation in a load are drawn in a region indicating the saturation of the power amplifier. The power amplifier 4 cannot be accurately controlled so that the amplitude of the power output thereof will be modified based on the output of the modulator 1. On the other hand, the minimum bias application point 42 applying a bias to the amplifier relative to the modulated wave of the maximum power output responsively to the variation in a load is drawn in a region indicating that the power amplifier is not saturated but controllable.

In the present embodiment, when a large bias is applied to the base-bias amplifier, that is, the amplifier delivers a large power output with respect to a predetermined threshold Pth, the transmitter circuit is operated as a polar-loop transmitter circuit. When a small bias is applied, that is, the amplifier delivers a moderate or small power output, the transmitter circuit is operated as an open-loop transmitter circuit. Consequently, the use of the amplifier under the conditions indicated by the bias application points 40 and 41 drawn in FIG. 9 can be avoided. The power amplifier can be accurately controlled based on the output of the modulator 1 irrespective of the loaded impedance of the power amplifier 4. Moreover, when the power amplifier delivers a moderate or small power output, open-loop control is adopted in order to modify the amplitude of the power output. Thus, a transmitter circuit requiring little current consumption can be provided.

Second Embodiment

Figure 10:
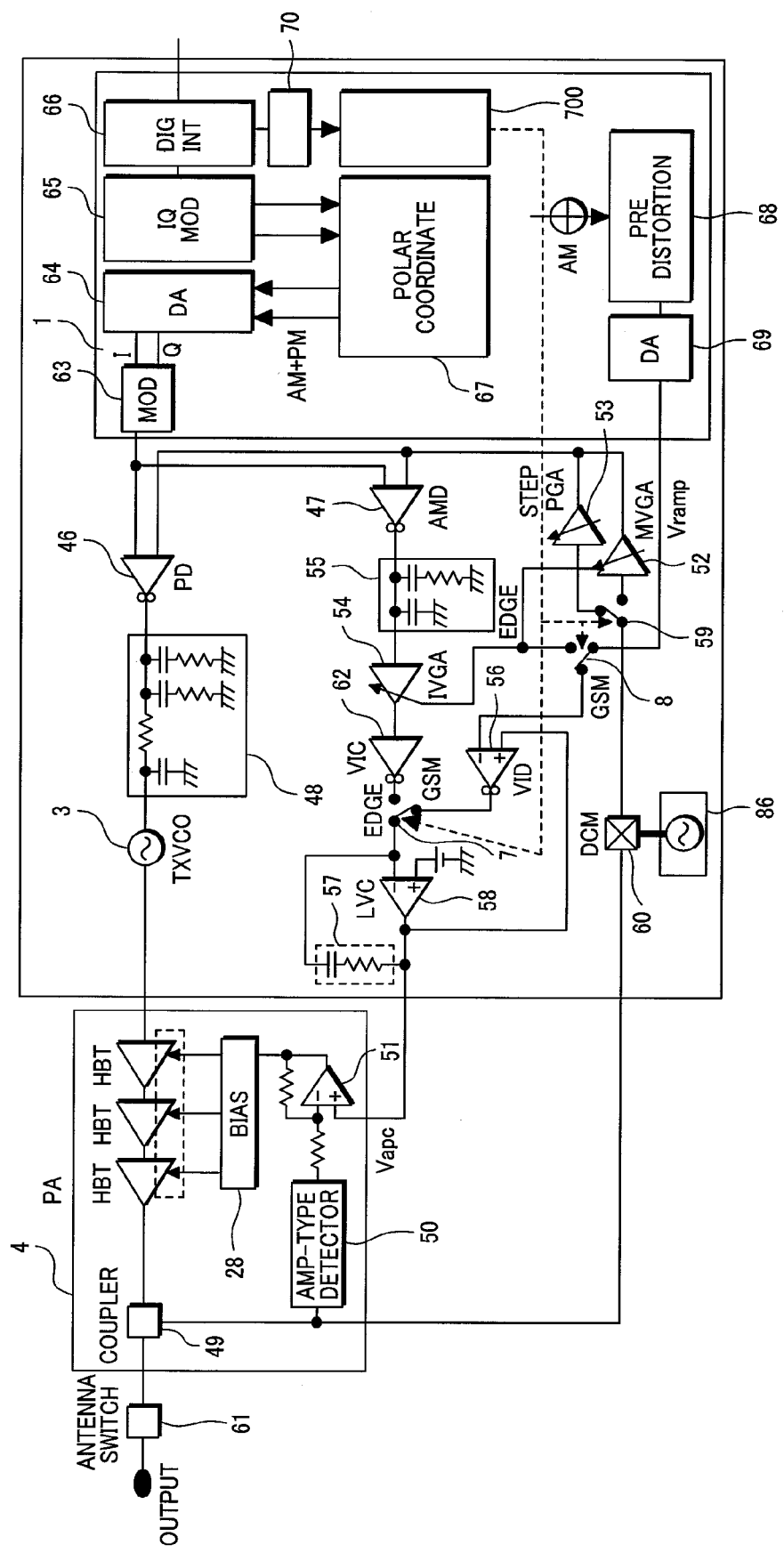
FIG. 10 shows a transmitter circuit in accordance with the second embodiment of the present invention.
Figure 11:
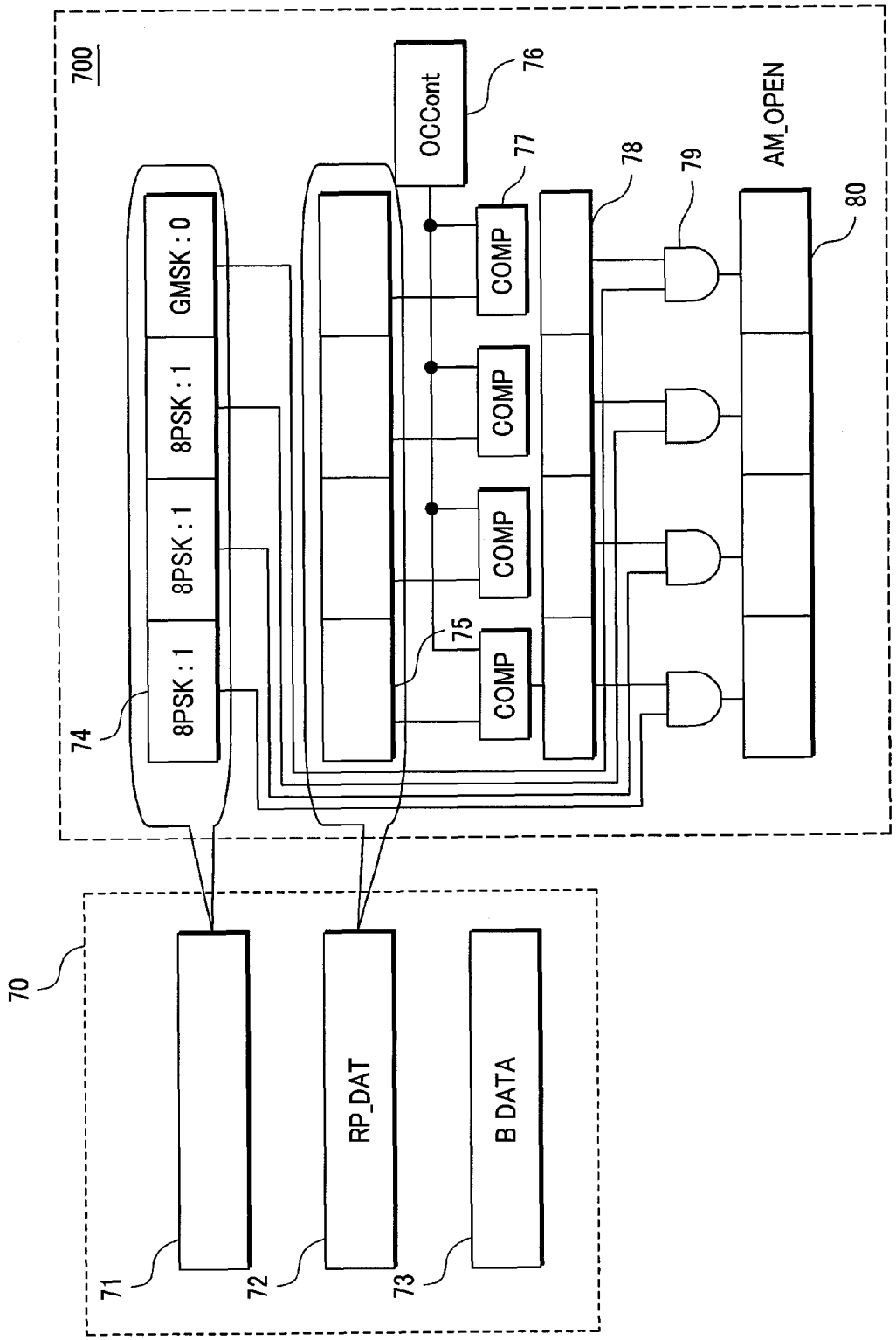
FIG. 11 shows an example of the configuration of an operating timing signal generation circuit employed in the embodiment shown in FIG. 10.
Figure 12:
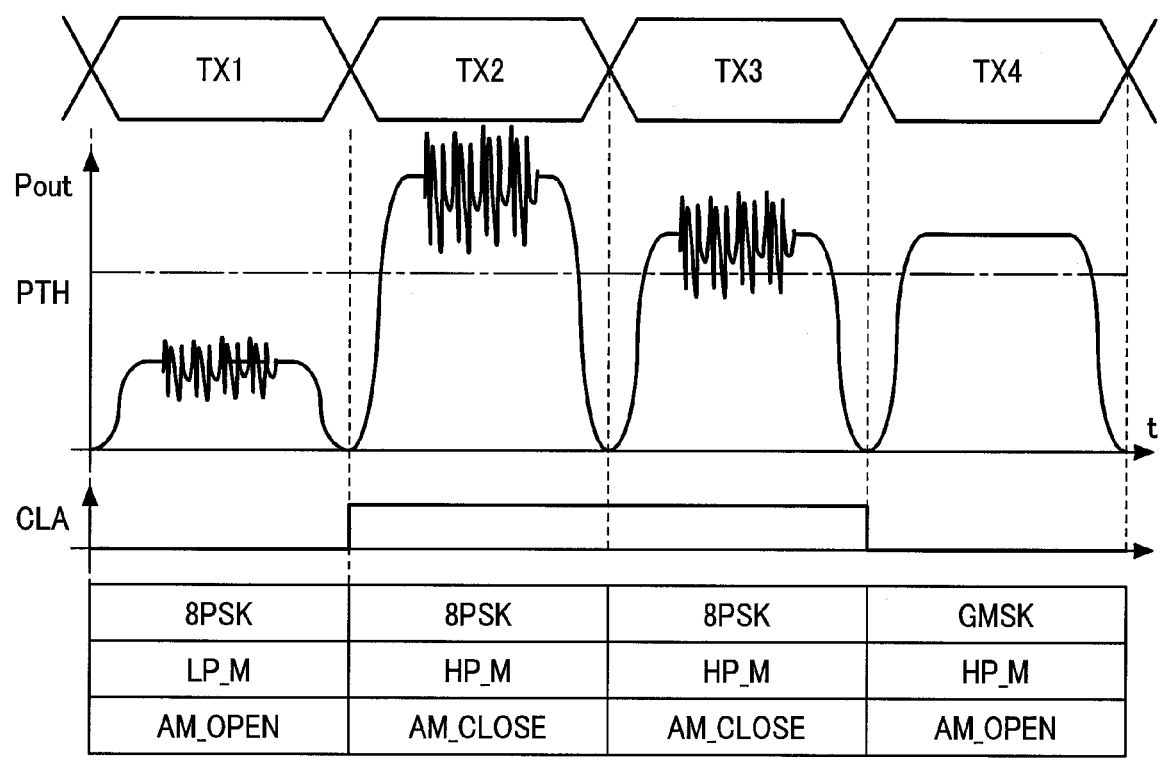
FIG. 12 shows operating timings for the second embodiment of the present invention.

Referring to FIG. 10 to FIG. 15, the second embodiment of the present invention will be described below. FIG. 10 shows the major portion of a transmitter circuit in accordance with the second embodiment of the present invention. FIG. 11 shows an operating timing signal generation circuit employed in the second embodiment. FIG. 12 is an explanatory diagram concerning the operation of the second embodiment.

In FIG. 10, there are shown a modulator 1, a phase detector 46, a loop filter 3 composed of a transmittal oscillator and a filter 48, a power amplifier 4, and an antenna switch 61. The power amplifier 4 includes a heterojunction bipolar transistors (HBTs) connected in multiple stages, a bias circuit 28, a coupler 49, a wave detection circuit 50, and an error amplifier 51. Moreover, components constituting a phase locked loop or an amplitude loop include an amplitude comparator 47, a variable amplifier 52, a stepping gain control amplifier 53, a variable amplifier 54, a loop filter 55, a voltage-to-current converter 56, a filter 57, a buffer amplifier 58, a mixer 60, and a voltage-to-current converter 62. Transmittal information sent from a baseband circuit to the modulator 1 (a ramp signal or transmittal data) is transferred to a digital I-channel/Q-channel modulator 65 via a digital interface 66. I-channel/Q-channel data sent from the digital I-channel/Q-channel modulator 65 is converted to be defined in a system of polar coordinates by a polar coordinates converter 67. An amplitude-modulated signal and a phase-modulated signal that are signal components are transferred to the phase detector 46 and amplitude comparator 47 respectively via a digital-to-analog converter 65 and an orthogonal modulator 63. Moreover, the amplitude-modulated signal having been converted by the polar coordinates converter 67 has the distortion thereof corrected by a predistortion circuit 68, and is then converted into a signal Vramp by a digital-to-analog converter 69. The amplitude of the power output of the power amplifier 4 is controlled to have a value proportional to the signal Vramp. The transmittal information (a ramp signal or transmittal data) sent from the baseband circuit to the modulator 1 is held in a transmittal data register 70. Based on the pieces of information, the switching control circuit 700 controls the switching actions of selection switches 7 and 8 and a selection switch 59 respectively. The signal Vramp is applied to a stationary terminal of the selection switch 8. The selection switches 7 and 8 each include contacts conformable to the GSM standard and EDGE standard respectively. Moreover, the selection switch 59 includes contacts providing connections to the variable amplifier 52 and the stepping gain control amplifier 53 respectively.

FIG. 11 shows an example of the configuration of a switching control unit that generates timing signals indicating the operating timings of the selection switches, that is, the configurations of the transmittal data register 70 and switching control circuit 700 respectively. The transmittal data register 70 includes a modulation setting register 71 that holds information on a modulation technique such as a the 8PSK or GMSK, a ramp signal register 72 that holds a ramp signal whose level is equivalent to that of the power output of the power amplifier 4, and a transmittal data register 73 that holds transmittal data. Data 74 of one burst in the modulation setting register 1 and information on a maximum value 75 within one burst in the ramp signal register are transferred to and held in the switching control circuit 700. Reference numeral 76 denotes an open/closed loop threshold register that holds a predetermined threshold Pth. Reference numeral 77 denotes a comparator that compares the ramp signal, of which level is equivalent to the level of the power output of the power amplifier 4, with the threshold Pth, and transmits a value of 1 or 0 according to the result of the comparison. Reference numeral 78 denotes a result-of-comparison resistor that holds the result of the comparison. Reference numeral 79 denotes an AND gate that calculates the AND of a modulation technique represented by the data 74 and the result of the comparison. The output of the AND gate 79 is recorded as carry look-ahead (CLA) data in an open/closed loop designation register 80.

A communication method to be implemented in the transmitter circuit for mobile communications is interchangeable with a GSM method that employs a GMSK modulation technique in which information is allocated to the phase of a signal with the amplitude thereof left constant for the purpose of normal transmission of voice, and an EDGE method that employs the 8-PSK modulation technique in which information is allocated even to the amplitude of a signal. The power amplifier 4 is compatible with both the communication methods. When the transmitter circuit transmits a phase-modulated signal, a feedback circuit operates without fail. When the transmitter circuit transmits an amplitude-modulated signal, either open-loop control or polar-loop control is extended based on the power output of the power amplifier.

FIG. 12 shows the operating timings of the second embodiment.

According to the GSM communication method, a transmittal signal is composed of four components to be transmitted during slots TX1 to TX4. The signal components TX1 to TX3 are modulated according to the 8-PSK, while the signal component TX4 is modulated according to the GMSK in which the amplitude of a signal is left constant. The amplitude of the power output of the power amplifier 4 is controlled in an open loop or a polar loop according to the relationship between the amplitude modulated according to the 8-PSK and the predetermined threshold Pth.

In FIG. 12, CLA denotes an output of the open-loop designation register 80. The connections through the selection switches are switched so that: when the output CLA is 0, open-loop control will be extended; and when the output CLA is 1, polar-loop control will be extended.

The switching control circuit 700 transmits a control signal with which the connections through the selection switches 7, 8, and 59 are switched, for example, a signal AM-OPEN so that: when the power output of the power amplifier 4 (specifically, a ramp signal transferred to the modulator 1) is equal to or higher than a certain threshold (specifically, a threshold Rth relevant to the ramp), an amplitude loop will be brought to a closed loop; and when the power output is equal to or lower than the threshold, the amplitude loop will be brought to an open loop. Specifically, the switching control circuit 700 uses the comparator 77 to compare a ramp signal, which is proportional to the power output of the power amplifier 4 and read from the transmittal data register 70, with the predetermined threshold Pth. Based on the result of the comparison, the switching control circuit 700 transmits data CLA so as to switch the connections through the selection switches 7, 8, and 59, and thus extends open-loop control or closed-loop control.

Although the data 74 in the modulation setting register is 1, since the signal component TX1 is modulated according to the 8-PSK, the AND 79 of the data 74 and the power output of the power amplifier 4 that falls below the threshold (LP) is 0. This brings data CLA to 0 (low). Consequently, open-loop-control is extended. Since the signal components TX2 and TX3 are modulated according to the 8-PSK, the AND 79 of the data 74 in the modulation setting register, which is 1, and the power output of the power amplifier 4, which is equal to or higher than the threshold (HP), becomes 1. This brings the data CLA to 1 (high). Consequently, closed-loop control is extended.

As for the GMSK of the signal component TX4, although the power output of the power amplifier 4 is equal to or larger than the threshold (HP), since the amplitude is left constant, the data 74 in the modulation setting register is 0. Therefore, the AND 79 of the data 74 and the power output is 0, and data CLA is 0. Consequently, open-loop control is extended.

As mentioned above, when the power amplifier 4 delivers a moderate or small power output, the switching control circuit 700 switches the connections through the selection switches 7 and 8 so as to select the connections provided by the GSM-conformable contacts, and switches the connections through the selection switch 59 so as to select the connection to the stepping gain control amplifier 53. At this time, phase information is transferred from the digital I-channel/Q-channel modulator 65 to the phase detector 46 via the orthogonal modulator 63, and compared with feedback information having passed through the stepping gain control amplifier 53. Based on the result of the comparison, a signal modulated by the loop filter 3 is transferred to the power amplifier 4. The stepping gain control amplifier 53 roughly controls a gain. In terms of control precision, the stepping gain control amplifier 53 is inferior to the variable amplifier 52. However, the stepping gain control amplifier 53 has a merit of consuming little power.

A signal Vramp that is amplitude information sent from the digital I-channel/Q-channel modulator 65 via the polar coordinates converter 67, predistortion circuit 68, and digital-to-analog converter 69 is transferred to the bias circuit 28 included in the power amplifier 4 via the selection switch 8, voltage-to-current converter 56, selection switch 7, loop filter 57, and buffer amplifier 58. Namely, the phase of a power output is controlled in a closed loop, while the amplitude thereof is controlled in an open loop.

When the power amplifier 4 delivers a large power output, data CLA is 1. The connections through the selection switches 7 and 8 are switched to select the connections provided by the EDGE-conformable contacts, and the connections through the selection switch 59 are switched to select the connection to the variable amplifier 52. Phase information is transferred from the digital I-channel/Q-channel modulator 65 to the phase detector 46 via the orthogonal modulator 63, and then compared with feedback information having passed through the variable amplifier 52. Based on the result of the comparison, a signal modulated by the loop filter is transferred to the power amplifier 4. In contrast, a signal Vramp that carries amplitude information is modulated while passing through the selection switch 8, variable amplifier 54, voltage-to-current converter 62, selection switch 7, loop filter 57, and buffer amplifier 58, and then transferred to the bias circuit 28 included in the power amplifier 4. Namely, both the phase and amplitude of a power output are controlled in a closed loop.

FIG. 13 is an explanatory diagram concerning actions to be performed when the power amplifier employed in the second embodiment delivers a large power output, that is, when the amplitude-modulated power output is controlled in a polar loop. When the power amplifier 4 delivers a large power output, an IF modulation signal sent from the orthogonal modulator 63 and amplitude-related feedback information having passed through the variable amplitude 52 are transferred to the amplitude comparator 47. An error signal that is the output of the amplitude comparator is integrated by the loop filter 55, and amplified by and fed back from the variable amplifier 54. The power amplifier 4 delivers a modulated signal. Assuming that the output $G_{1a}$ of the variable amplifier 52 corresponds to G1+ΔG, the output $G_{2a}$ of the variable amplifier 54 is expressed as G2-ΔG. Herein, $G_{1a}+\Delta G+G_{2a}-\Delta G=G_1+G_2$=constant is established. In other words, the variable amplifier 54 cancels an increase or a decrease in the output of the variable amplifier 52 so that a loop gain will be held constant.

As mentioned above, when polar-loop control is extended, the variable amplifier 52 and variable amplifier 54 constitute a sort of fixed amplifier.

On the other hand, when the power amplifier 4 delivers a moderate or small power output, open-loop control is extended in order to modify the amplitude of the power output. Specifically, the amplitude of the power output of the power amplifier 4 is controlled based on a signal Vramp carrying amplitude information. Moreover, the phase of the power output is controlled while being fed back via the stepping gain control amplifier 53. Consequently, the variable amplifier 52, amplitude comparator 47, loop filter 55, variable amplifier 54, and voltage-to-current converter 62 are inactivated. Thus, the transmitter circuit is configured to a transmitter circuit that requires little current consumption.

In the present embodiment, even when a modulated signal whose amplitude varies is transmitted, the switching control circuit 700 can accurately switch an open loop and a closed loop according to a signal level.

As described above, in the present embodiment, when the power amplifier delivers a large power output exhibiting strong nonlinearity, the transmitter circuit is operated as a polar-loop transmitter circuit in which two feedback circuits intended to control the amplitude and phase of the power output respectively are active. When the power amplifier delivers a moderate or small power output exhibiting linearity, open-loop control is extended in order to modify the amplitude of the power output. Thus, current consumption required for the delivery of the moderate or small power output can be reduced.

According to the second embodiment of the present invention, when the phase of a power output is controlled, the variable amplifier 52 and stepping gain control amplifier 53 are switched based on the level of the power output of the power amplifier. When the amplitude of the power output is controlled, an open loop and a closed loop are switched. The advantages of the second embodiment will be described below.

Figure 14A:
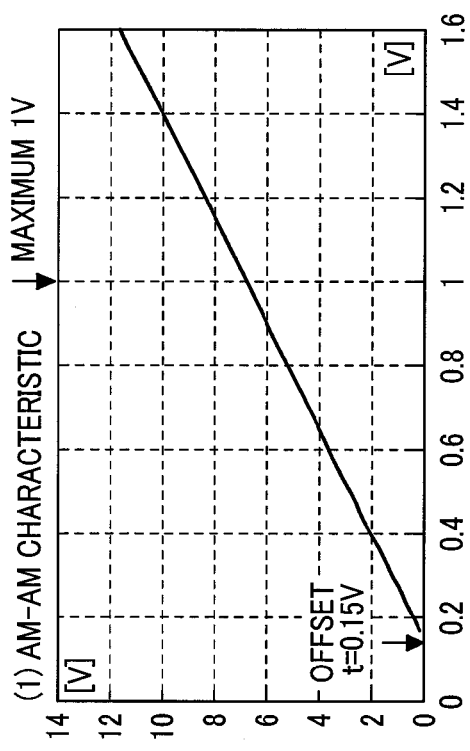
FIG. 14A shows the conditions for simulation relevant to phase distortion observed in the second embodiment of the present invention.

To begin with, phase distortion occurring in the second embodiment of the present invention will be described in conjunction with FIG. 14A and FIG. 14B. FIG. 14A shows the conditions for simulation of phase distortion. The relationship between the amplitude of an input and the amplitude of an output, that is, the assume AM to AM characteristics is linear as it is represented by a characteristic curve shown in FIG. 14A(1). As for a phase distortion characteristic, that is, an amplitude-to-phase characteristic, the relationship between the amplitude of the output and the phase thereof is assessed over a range of changes in a phase to be transmitted from curves (a) 1.00 deg/dB to 0.02 deg/dB expressed by characteristic to (j) in FIG. 14A(2) and FIG. 14A(3). FIG. 14B graphically shows the results of the simulation of phase distortion. As shown in FIG. 14B(1), the amplitude-to-phase characteristic or phase distortion characteristic meets a standard when the change in a phase to be transmitted is 0.20 deg/dB shown by the curve (e). However, an error vector magnitude (EVM) representing precision in modulation does not satisfy a standard (5% or less). For example, the smallest EVM is 9.9% of which the change in a phase to be transmitted is 0.20 deg/dB. On the other hand, as shown in FIG. 14B(2), when the amplitude-to-phase characteristic or the phase distortion characteristic is represented by the characteristic curves (f) to (j), that is, when the change in a phase to be transmitted ranges from 0.10 deg/dB to 0.02 deg/dB as expressed with the characteristic curves (f) to (j), the EVM representing precision in modulation meets the standard. For example, the largest EVM is 5.0% of which the change in a phase to be transmitted is 0.10 deg/dB. Incidentally, when the change in the phase is about 0.1 deg/dB expressed with the characteristic curve (f), the transmitter circuit uses the stepping gain control amplifier 53 to operate as a phase locked loop. When the change in the phase is equal to or lower than 0.02 deg/dB expressed with the characteristic curve (j), the transmitter circuit operates as a polar-loop transmitter circuit.

Figure 15A:
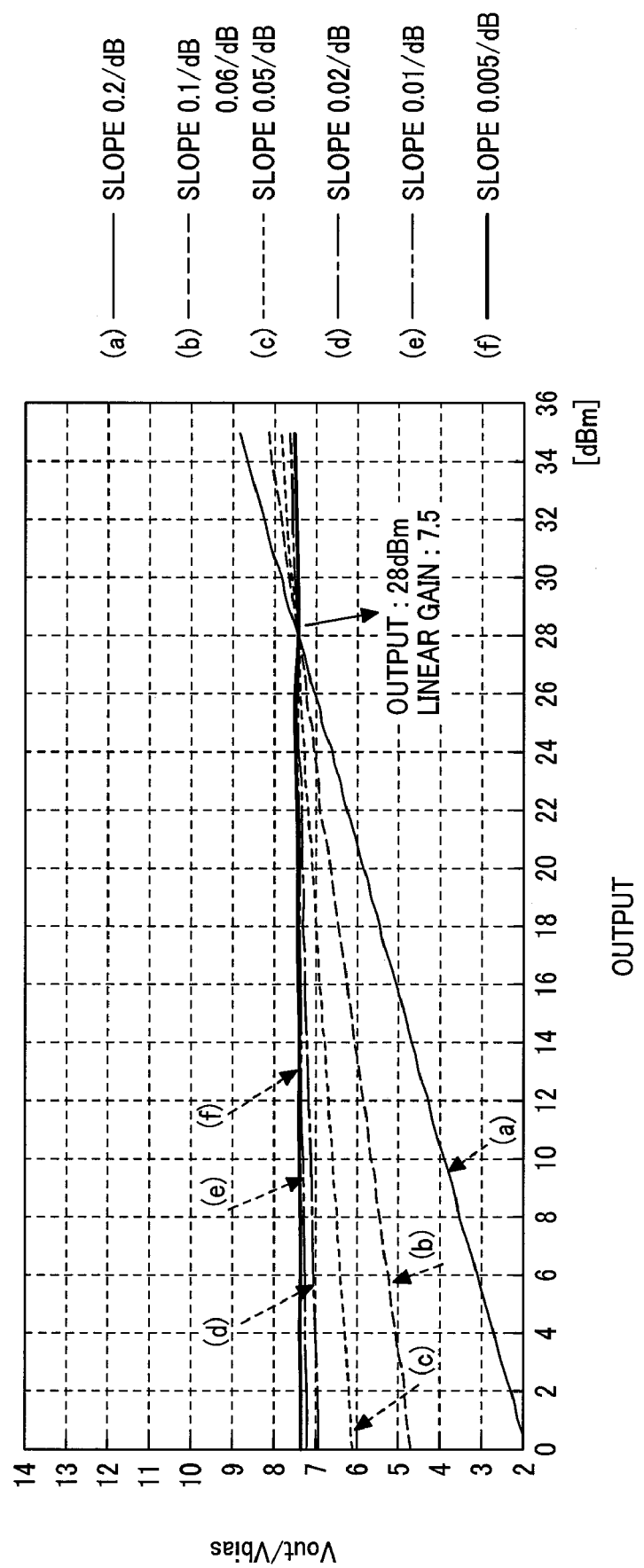
FIG. 15A shows the conditions for simulation relevant to amplitude distortion observed in the second embodiment of the present invention.

Referring to FIG. 15A and FIG. 15B, an amplitude distortion occurring in the second embodiment of the present invention will be described below. FIG. 15A shows conditions for simulation of amplitude distortion. As shown in FIG. 15A, linear gains represented by lines (a) to (f) vary at rates ranging from 0.2/dB to 0.005/dB. FIG. 15B shows the results of simulation. In FIG. 15B, the linear gains varying at the rates equal to or lower than 0.02/dB expressed with the line (d) satisfy a standard. Namely, when the power amplifier delivers a large power output, since the transmitter circuit is operated as a polar-loop transmitter circuit, the linearity of the power amplifier improves and the gain produced thereby satisfies the standard. When the power amplifier delivers a moderate or small power output, since distortion is limited, the gain satisfies the standard even in an open loop configuration.

In other words, when the power amplifier delivers a large power output while exhibiting strong nonlinearity, the transmitter circuit is, similarly to the present embodiment, operated as a polar-loop transmitter circuit in which two feedback circuits intended to control the amplitude and phase of the power output respectively are active. When the power amplifier delivers a moderate or small power output, open-loop control is extended. Thus, the transmitter circuit can satisfy standards over a wide range of power output levels.

As described above, for delivery of a large power output, the transmitter circuit is operated as a polar-loop transmitter circuit. For delivery of a moderate or small power output, the transmitter circuit is operated as an open-loop transmitter circuit. Consequently, the power amplifier 4 can be accurately controlled based on the output of the modulator 1 irrespective of the loaded impedance of the power amplifier 4. Moreover, when the moderate or small power output is delivered, if the transmitter circuit is operated to control the amplitude of the power output in an open loop, the transmitter circuit is provided as a transmitter circuit requiring little current consumption.

Third Embodiment

Figure 16:
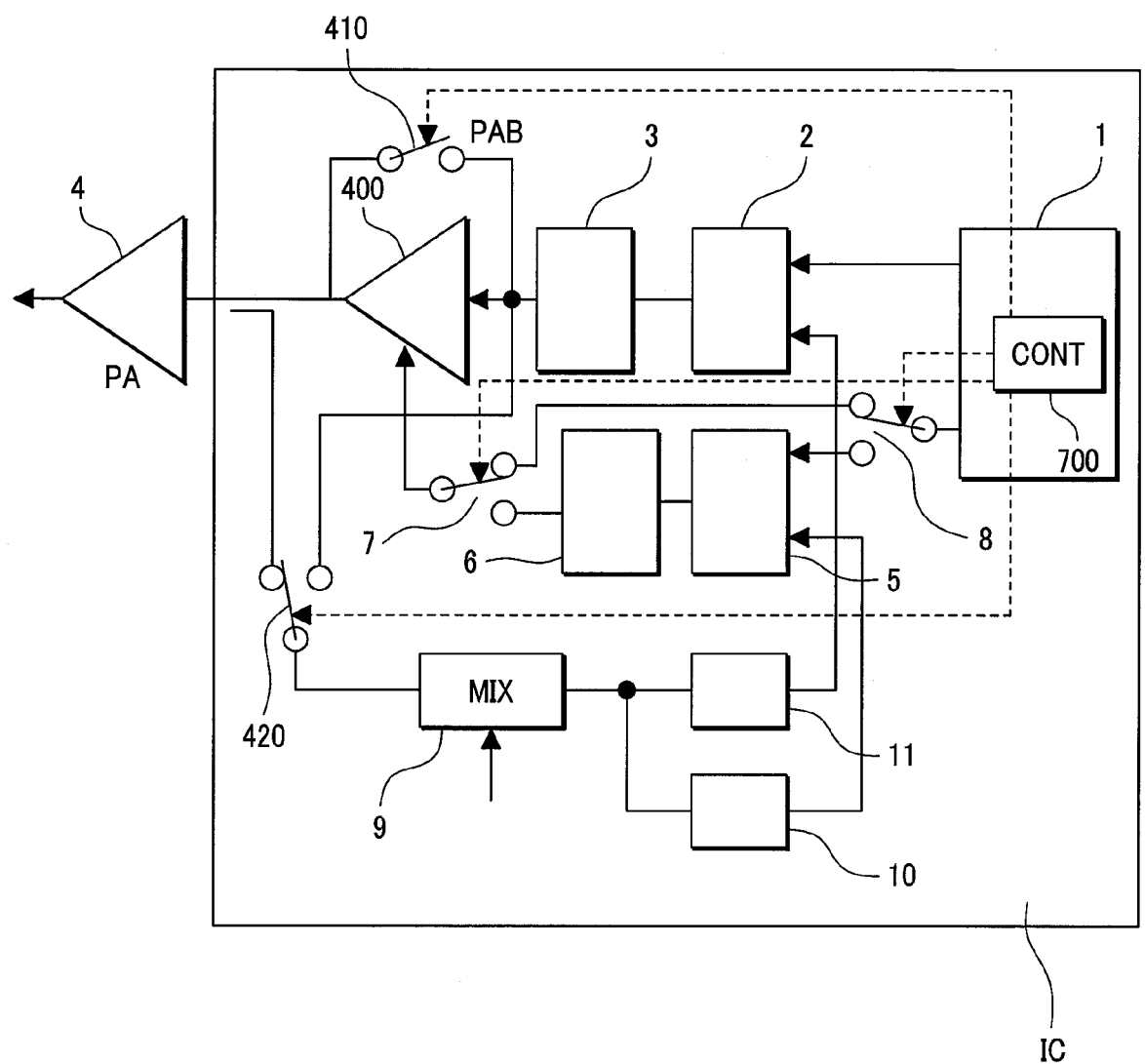
FIG. 16 shows a transmitter circuit in accordance with the third embodiment of the present invention.
Figure 17:
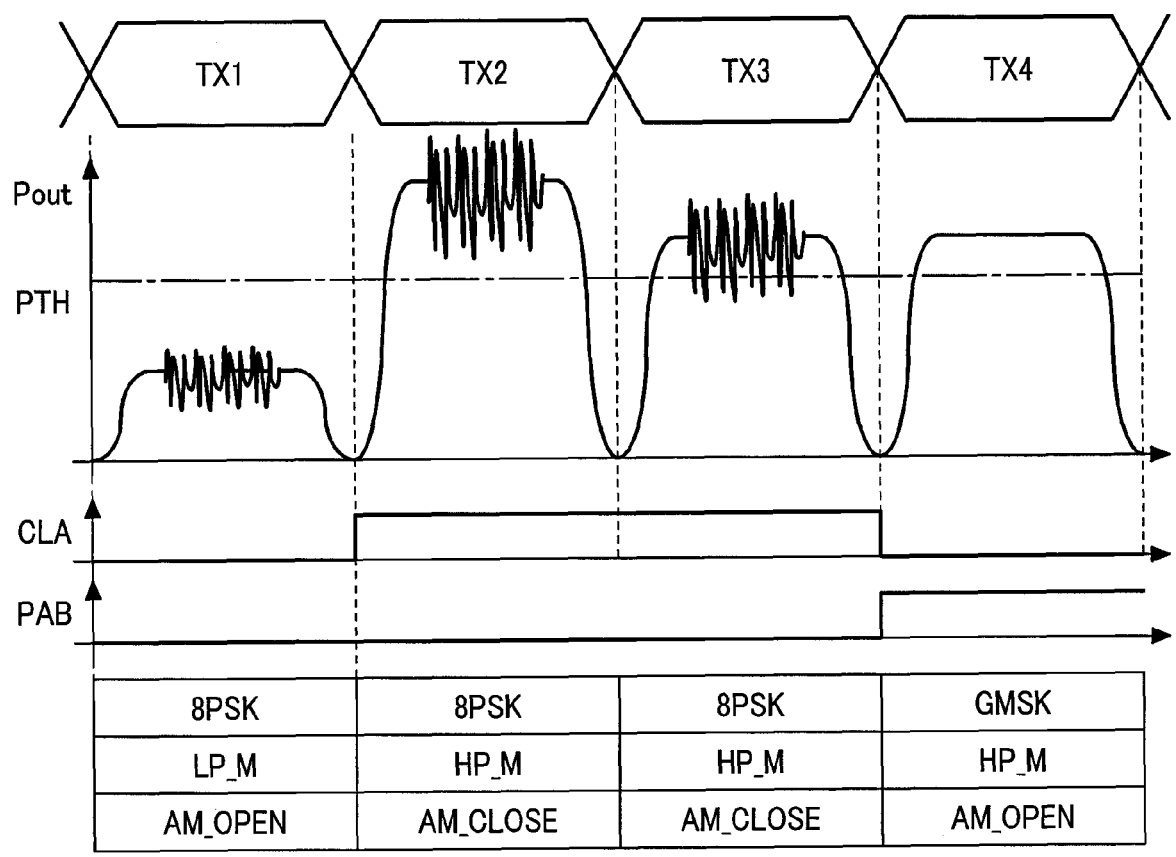
FIG. 17 shows operating timings for the third embodiment of the present invention.

FIG. 16 and FIG. 17 show the third embodiment of the present invention. FIG. 16 shows a transmitter circuit in accordance with the third embodiment of the present invention. FIG. 17 shows the operating timings of the present embodiment. In the present embodiment, unlike the first embodiment, a buffer amplifier 400 is interposed between the loop filter 3 and power amplifier 4 while being included in a radiofrequency IC. A bypass switch 410 is connected in parallel with the buffer amplifier 400. A feedback control signal is fetched from the output terminal of the buffer amplifier 400 within the radiofrequency IC. A selection switch 420 through which the routing of the output of the mixer 9 to the control input terminal of the power amplifier 4 and the routing thereof to the input terminal of the buffer amplifier 400 are switched is included in the radiofrequency IC. The switching control circuit 700 transmits a control signal with which the connections through the selection switches 7 and 8 as well as the connections through the bypass switches 410 and 420 are switched. The power output of the power amplifier 4 is controlled by a circuit outside the radiofrequency IC.

FIG. 17 shows the operating timings of the present embodiment. The power amplifier is controlled in either an open loop or a polar loop according to the relationship between the amplitude of a signal modulated according to the 8-PSK and a predetermined threshold Pth, whereby the amplitude of the power output of the power amplifier 4 is modified. As for a signal modulated according to the GMSK, since a frequency-modulated signal is unnecessary, open-loop control is extended. CLA in FIG. 17 denotes the output of the closed-loop designation register 80. The connections through the selection switches are switched so that: when the output CLA is 0, open-loop control will be extended; and when the output CLA is 1, polar-loop control will be extended. When a signal PAB is 0, that is, when signal components TX1 to TX3 have the amplitudes thereof modulated according to the 8-PSK, the bypass switch 410 is broken, and the output of the mixer 9 is applied to the control input terminal of the power amplifier 4 through the bypass switch 420. When the signal PAB is 1, that is, when a signal TX4 is modulated according to the GMSK, the connections through the bypass switch 420 are switched to select the connection to the input terminal of the buffer amplifier 400, and the bypass switch 410 is made.

According to the present embodiment, since all frequency-modulated signals are produced and handled within the single radiofrequency IC, generation of noise is subdued. This obviates the necessity of interposing a noise cancellation filter between the buffer amplifier 400 and power amplifier 4, and leads to a reduction in a cost.

Fourth Embodiment

Figure 18:
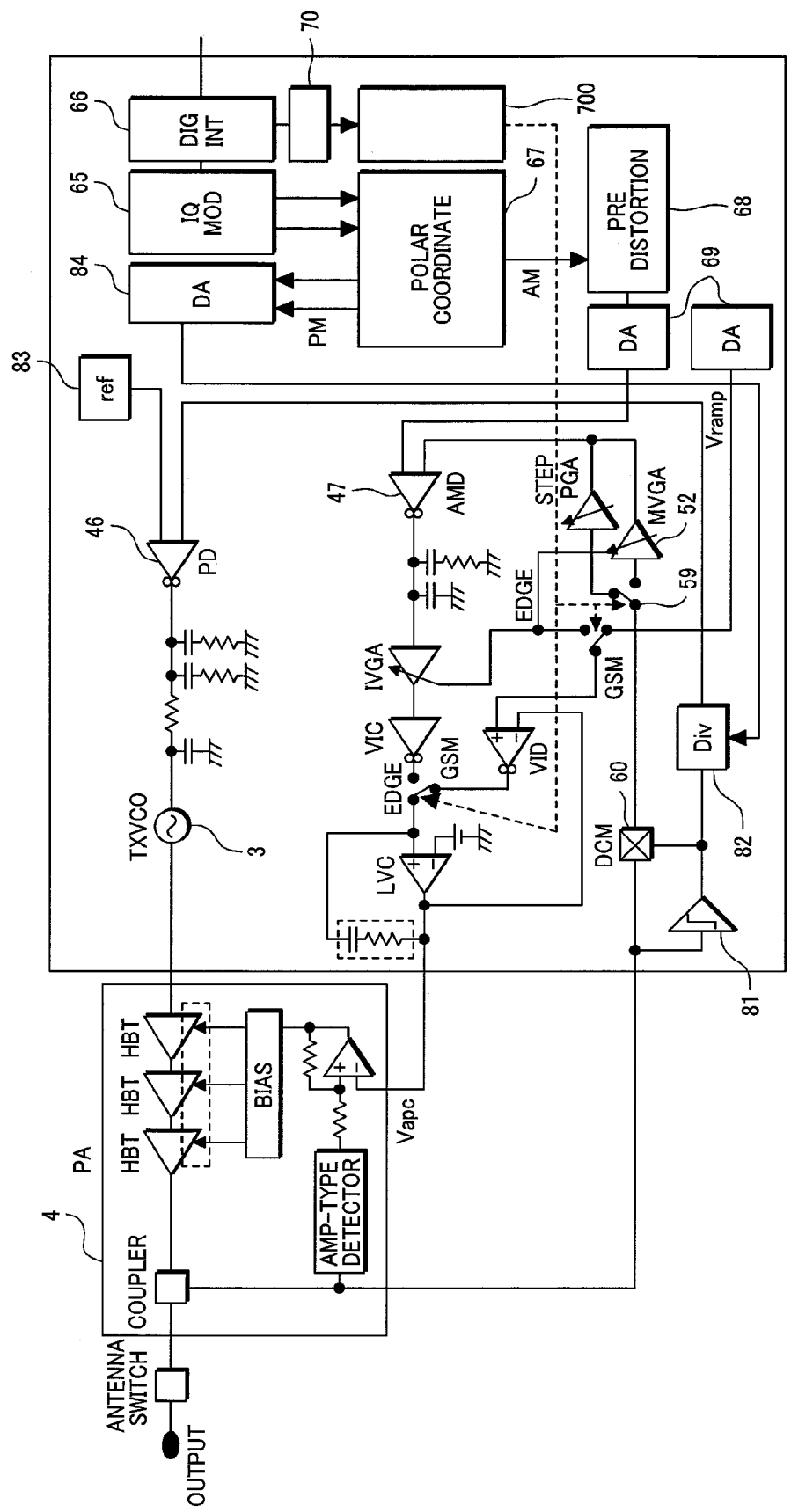
FIG. 18 shows a transmitter circuit in accordance with the fourth embodiment of the present invention.
Figure 19:
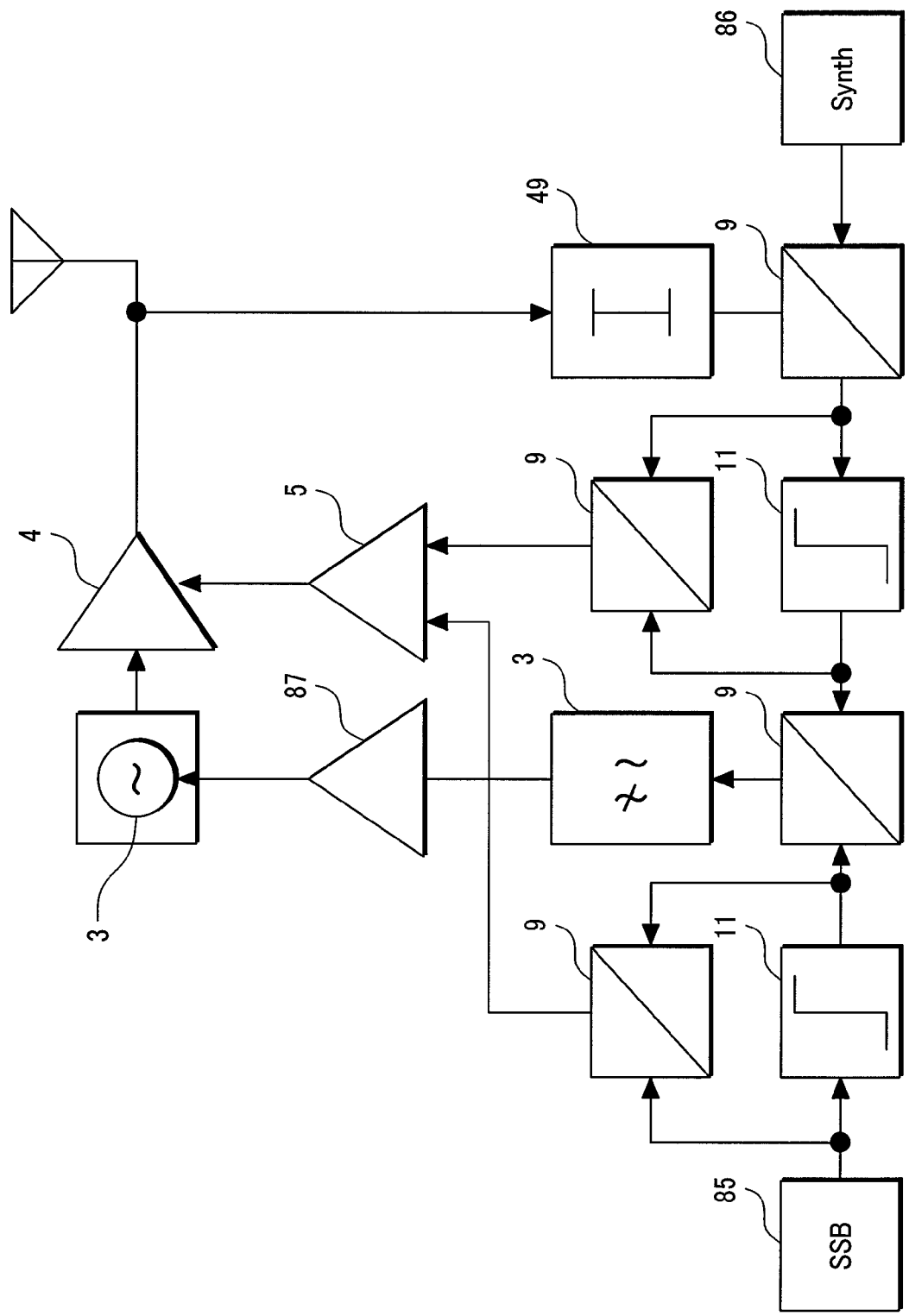
FIG. 19 shows a conventional type of transmitter circuit.

FIG. 18 shows the major portion of a transmitter circuit in accordance with the fourth embodiment of the present invention.

The present embodiment is characterized in that an offset transmitter is used as a phase locked loop. In FIG. 18, the phase locked loop includes a loop filter 3, a power amplifier 4, a limiter amplifier 81, a variable frequency divider 82, a phase detector 46, and a reference signal source 83. A transmittal signal is transferred to a digital I-channel/Q-channel modulator 65 via a digital interface 66 included in a baseband IC. A phase-modulated signal component produced by a polar coordinates converter 67 is regulated to have a high frequency corresponding to a multiple of the frequency of a reference clock by a constant, and applied to the control input terminal of the variable frequency divider 82. The variable frequency divider 82 produces an offset necessary for the output of the limiter amplifier 81. A feedback control signal having undergone the offset is compared with a reference signal, which is sent from the reference signal source 83, by the phase detector 46. Based on a resultant phase control signal, the phase of the power output of the power amplifier 4 is controlled. The configuration for controlling the amplitude of the power output is identical to that included in the second embodiment of the present invention. An iterative description will be omitted.

In the present embodiment, an offset transmitter is used as a phase locked loop in order to realize stable operation. When a ΔΣ transmitter is used as the phase locked loop and a mixer is excluded, power consumption can be further reduced.

Fifth Embodiment

A transmitter circuit in accordance with the present invention can be applied to a wireless communication apparatus for mobile communications that is suitable for the EDGE which is a broadband transmission facility evolved from the GSM. In this case, a transmission unit included in the wireless communication apparatus is provided with a transmitter circuit in accordance with any of the aforesaid embodiments. For example, the transmission unit includes a high-frequency power amplification module, a high-frequency IC including a gain programmable amplifier (AGC), and a bias control block. The high-frequency power amplification module includes the power amplifier, analog-to-digital converter, and bias control circuit which are included in the aforesaid embodiments, and is mounted in the form of a microwave monolithic IC (MMIC) on one ceramic substrate. Part of a baseband control circuit including an output control block is included in the transmission unit. The baseband control circuit includes a modulation/demodulation circuit capable of modulating or demodulating a signal conformable to the GSM standard or EDGE standard, a baseband circuit that produces an I-channel signal and a Q-channel signal on the basis of transmittal data (a baseband signal) or handles an I-channel signal and a Q-channel signal sampled from a received signal, a bandpass filter (BPF1) that removes a harmonic component from a transmittal signal, and a bandpass filter (BPF2) that removes an unnecessary wave from a received signal. The baseband control circuit is encased in a package.

According to the present embodiment, there is provided a wireless communication apparatus for mobile communications including a transmitter circuit in which the relationship between the amplitude of an input of a power amplifier and the amplitude of an output and the relationship between the amplitude of the output of the power amplifier and the phase thereof, that is, the amplitude-to-amplitude characteristic of the power amplifier and the amplitude-to-phase characteristic thereof are properly sustained irrespective of whether the output power is large or small, and which requires little current consumption.

What is claimed is:

1. A transmitter circuit including a phase locked loop that controls a phase of a power output of a power amplifier and an amplitude loop that controls an amplitude of the power output of the power amplifier, comprising:
   a switching control unit that switches the amplitude loop from an open loop to a closed loop or vice versa,
   wherein, in case that the power amplifier delivers a large power output, the switching control unit brings the amplitude loop to the closed loop,
   wherein, in case that the power amplifier delivers a small power output, the switching control unit brings the amplitude loop to the open loop,
   wherein the phase locked loop includes: the power amplifier; a first loop filter; a limiter amplifier; and a phase detector,
   wherein the amplitude loop includes: the power amplifier; an amplitude-modulated wave detection circuit; an amplitude comparator; and a second loop filter,
   wherein, in case that the power amplifier delivers a large power output, the amplitude loop is brought to a closed loop so that the power output will have the amplitude thereof modified based on an output signal of a modulator and a feedback control signal, and
   wherein, in case that the power amplifier delivers a small power output, the amplitude loop is brought to an open loop, in which the amplitude loop does not include the amplitude-modulated wave detection circuit, amplitude comparator, and second loop filter, so that the power output will have the amplitude thereof modified based on the output signal of the modulator.

2. The transmitter circuit according to claim 1,
   wherein the switching control unit includes:
   a first selection switch through which the control input terminal of the power amplifier is connected to either the modulator or the second loop filter included in the amplitude loop;
   a second selection switch through which the modulator is connected to either the first selection switch or the amplitude comparator; and
   a switching control circuit that switches the connections through the first and second selection switches according to transmittal information representing the power output level of the power amplifier.

3. A transmitter circuit including a phase locked loop that controls a phase of a power output and an amplitude loop that controls an amplitude of the power output, comprising:
   a switching control unit that switches the amplitude loop from a closed loop to an open loop or vice versa,
   wherein, in case that the power output is larger than a predetermined threshold, the switching control unit brings the amplitude loop to a closed loop,
   wherein, in case that the power output is smaller than the predetermined threshold, the switching control unit brings the amplitude loop to an open loop,
   wherein the predetermined threshold is used to discriminate a period, during which the power amplifier included in the transmitter circuit delivers a large power output, from the period during which a power amplifier delivers a small power output, and
   wherein the switching control unit compares a signal, which represents a power output level of the power amplifier and is contained in transmittal information, with the predetermined threshold, and switches the amplitude loop from the closed loop to the open loop or vice versa.

4. The transmitter circuit according to claim 3,
   wherein the transmitter circuit is compatible with the EDGE communication standard, and uses a ramp signal, which represents the power output level of the power amplifier and is contained in the transmittal information, as a signal representing the power output level.

5. The transmitter circuit according to claim 3,
   wherein a regulator is included in the power amplifier so that the power output of the power amplifier will be controlled by regulating a supply voltage.

6. The transmitter circuit according to claim 3,
   wherein the power output of the power amplifier is controlled by adjusting either a gate bias or a base bias to be applied to the power amplifier.

7. The transmitter circuit according to claim 3,
wherein, in case that the power amplifier delivers a large power output, a polar-loop transmitter circuit composed of the phase locked loop and amplitude loop is configured; and
wherein, in case that the power amplifier delivers a small power output, the amplitude loop is brought to an open loop and the phase locked loop alone is held in a closed loop.

8. An apparatus for wireless applications including a transmitter circuit that comprises:
a power amplifier;
a modulator which transmits a phase control signal and an amplitude control signal, which are used to control the power amplifier, according to transmittal information;
a phase locked loop which controls a phase of a power output of the power amplifier according to the phase control signal; and
an amplitude loop which controls an amplitude of the power output of the power amplifier according to the amplitude control signal,
wherein the phase locked loop includes: the power amplifier; a first loop filter; a variable amplifier; and a phase amplifier,
wherein the amplitude loop includes: the power amplifier; an amplitude-modulated wave detection circuit; an amplitude comparator; and a second loop filter,
wherein the apparatus further includes: a switching control unit that switches the amplitude loop from a closed loop to an open loop or vice versa according to the transmittal information,
wherein the switching control unit includes:
a first selection switch through which a control input terminal of the power amplifier is connected to either the modulator or the second loop filter;
a second selection switch through which the modulator is connected to either the first selection switch or the amplitude comparator; and
a switching control circuit that switches connections through the first and second selection switches according to a power output level of the power amplifier,
wherein, in case that the power amplifier delivers a large power output, the switching control unit brings the amplitude loop to a closed loop, and
wherein, in case that the power amplifier delivers a small power output, the switching control unit brings the amplitude loop to an open loop in which the amplitude loop does not include the amplitude-modulated wave detection circuit, the amplitude comparator, and the second loop filter.

9. The apparatus for wireless applications according to claim 8,
wherein the phase locked loop includes a stepping gain control amplifier connected in parallel with the variable amplifier via the first selection switch,
wherein, in case that the power amplifier delivers a large power output, the switching control unit adopts the variable amplifier as a component of the phase locked loop, and
wherein, in case that the power amplifier delivers a small power output, the switching control unit adopts the stepping gain control amplifier as a component of the phase locked loop.

10. The apparatus for wireless applications according to claim 8,
wherein the amplitude loop is a circuit which comprises: a coupler included in the power amplifier; a first variable amplifier; the amplitude comparator; a second variable amplifier; a first current-to-voltage converter; the second loop filter; a second variable amplifier; and a second current-to-voltage converter,
wherein the second variable amplifier and the second current-to-voltage converter is connected in parallel with the first variable amplifier and the first current-to-voltage converter, respectively, via a second selection switch,
wherein, in case that the power amplifier delivers a large power output, the switching control unit adopts the circuit, which comprises: the power amplifier; the coupler; the first variable amplifier; the amplitude comparator; the first current-to-voltage converter; and the second loop filter, as a component of the amplitude loop, and
wherein, in case that the power amplifier delivers a small power output, the switching control unit adopts the circuit, which comprises: the power amplifier; the coupler; the second variable amplifier; the amplitude comparator; and the loop filter, as a component of the amplitude loop.

11. The apparatus for wireless applications according to claim 8,
wherein the phase locked loop includes a limiter amplifier interposed between the coupler included in the power amplifier and the phase detector and a variable frequency divider that produces an offset for the output of the limiter amplifier.

12. The apparatus for wireless applications according to claim 11,
wherein a $\Delta\Sigma$ transmitter is adopted as the phase locked loop.

13. The apparatus for wireless applications according to claim 8,
wherein a buffer amplifier is connected between the first and second loop filters and the power amplifier,
wherein a feedback control signal to be routed to the phase locked loop and the amplitude loop is fetched from a second coupler connected to the output terminal of the buffer amplifier, and
wherein the first loop filter, the variable amplifier, the phase detector, the amplitude-modulated wave detection circuit, the amplitude comparator, and the second loop filter included in the amplitude loop, the buffer amplifier, and the second coupler are monolithically integrated in a common radiofrequency integrated circuit device.

14. The apparatus for wireless applications according to claim 8,
wherein the switching control unit includes a transmittal data register, and
wherein the transmittal data register includes a modulation setting register that holds information on a modulation technique such as the 8PSK or GMSK, a ramp signal register that holds a ramp signal whose level is equivalent to the power output level of the power amplifier, and a transmittal data register that holds the transmittal data.

15. The apparatus for wireless applications according to claim 14,
wherein the switching control unit includes a switching control circuit, and
wherein the switching control circuit uses a comparator to compare a ramp signal, which is equivalent to the power output of the power amplifier and read from the transmittal data register, with a predetermined threshold, and switches the connections through the selection switches according to the result of the comparison so that open-loop control or closed-loop control can be extended.

* * * * *